United States Patent
Hellberg

(10) Patent No.: US 6,940,349 B2
(45) Date of Patent: Sep. 6, 2005

(54) TRANSMITTER INCLUDING A COMPOSITE AMPLIFIER

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/335,154

(22) Filed: Jan. 2, 2003

(65) Prior Publication Data

US 2003/0137346 A1 Jul. 24, 2003

Related U.S. Application Data

(63) Continuation of application No. PCT/SE01/01419, filed on Jun. 19, 2001.

(51) Int. Cl.[7] ................................................ H03F 3/68
(52) U.S. Cl. ................................... 330/124 R; 330/295
(58) Field of Search ........................... 330/124 R, 149, 330/304, 295, 84, 151, 302, 144

(56) References Cited

U.S. PATENT DOCUMENTS

| | | | | |
|---|---|---|---|---|
| 5,420,541 A | * | 5/1995 | Upton et al. ................ | 330/286 |
| 5,719,527 A | | 2/1998 | Bateman et al. | |
| 5,786,727 A | * | 7/1998 | Sigmon .................... | 330/124 R |
| 5,880,633 A | | 3/1999 | Leizerovich et al. | |
| 6,133,788 A | * | 10/2000 | Dent ....................... | 330/124 R |
| 6,252,461 B1 | * | 6/2001 | Raab ....................... | 330/302 |
| 6,320,462 B1 | * | 11/2001 | Alley ...................... | 330/124 R |
| 6,356,149 B1 | * | 3/2002 | Stengel et al. ............ | 330/107 |
| 6,469,581 B1 | * | 10/2002 | Kobayashi ................. | 330/295 |
| 6,472,934 B1 | * | 10/2002 | Pehlke ..................... | 330/10 |
| 6,617,929 B2 | * | 9/2003 | Kim et al. ................ | 330/295 |
| 6,639,464 B2 | * | 10/2003 | Hellberg .................. | 330/124 R |
| 6,731,172 B2 | * | 5/2004 | Thompson ................. | 330/295 |

FOREIGN PATENT DOCUMENTS

| | | |
|---|---|---|
| EP | 0 630 104 A | 12/1994 |
| WO | 97/20385 A | 6/1997 |

OTHER PUBLICATIONS

International Search Report completed Dec. 20, 2000.
International Preliminary Examination Report completed Jul. 1, 2002.

* cited by examiner

Primary Examiner—Henry Choe
(74) Attorney, Agent, or Firm—Nixon & Vanderhye, P.C.

(57) ABSTRACT

A composite amplifier includes a main power amplifier (10) and an auxiliary power amplifier (12), which are connected to a load (14) over a Doherty output network (16). A non-linear function (18) and a cross-coupling filter (22) emulate the non-linear behavior of the output current of the auxiliary power amplifier (12) and the resulting emulating signal is subtracted from the input signal to said main amplifier (10).

24 Claims, 15 Drawing Sheets

TRANSMITTER INCLUDING A COMPOSITE AMPLIFIER

This application is a continuation of international application PCT/SEO1/01419 filed 19 Jun. 2001 which designates the U.S.

TECHNICAL FIELD

The present invention relates to a composite amplifier of the type that includes a main power amplifier and an auxiliary power amplifier, which are connected to a load over a Doherty output network. The invention also relates to a transmitter including such an amplifier.

BACKGROUND

In cellular base stations, satellite communications and other communications and broadcast systems, many radio frequency (RF) carriers, spread over a large bandwidth, are amplified simultaneously in the same high power amplifier. For the power amplifier this has the effect that the instantaneous transmit power will vary very widely and very rapidly. This is because the sum of many independent RF carriers (i.e. a multi-carrier signal) tends to have a large peak-to-average power ratio. It also tends to have a similar amplitude distribution as bandpass filtered Gaussian noise, which has a Rayleigh distribution.

The main difficulties in a PA are efficiency and linearity. A conventional class B power amplifier exhibits maximum DC to RF power conversion efficiency when it delivers its peak power to the load. Since the quasi-Rayleigh distribution of amplitudes in the summed transmit signal implies a large difference between the average power and the peak power, the overall efficiency when amplifying such a signal in a conventional class B amplifier is very low. For a quasi-Rayleigh distributed signal with a 10 dB peak-to-average power ratio, the efficiency of an ideal class B amplifier is only 28%, see [1].

The linearity of an RF power amplifier is usually characterized by its AM—AM (AM=amplitude modulation) and AM–PM (PM=phase modulation) distortion characteristics. Non-linearities manifest themselves as cross-mixing of different parts of the signal, leading to leakage of signal energy into undesired frequency bands. By restricting the output signal to a smaller part of the total voltage swing of the power amplifier, the linearity can be increased. However, this reduces the efficiency of the amplifier even further. The linearity of a power amplifier is also greatly reduced if the amplifier saturates (the output voltage is clipped). This means that it is not possible to increase efficiency by driving the amplifier into saturation, since the distortion will then reach unacceptable levels.

One way of increasing the efficiency of an RF power amplifier is to use the Doherty principle [1, 2, 3]. The Doherty amplifier uses in its basic form two amplifier stages, a main and an auxiliary amplifier (also called carrier and peaking amplifier, respectively). The load is connected to the auxiliary amplifier, and the main amplifier is connected to the load through an impedance-inverter, usually a quarter wavelength transmission line or an equivalent lumped network.

At low output levels only the main amplifier is active, and the auxiliary amplifier is shut off. In this region, the main amplifier sees a higher (transformed) load impedance than the impedance at peak power, which increases its efficiency in this region. When the output level climbs over the so-called transition point (usually at half the maximum output voltage), the auxiliary amplifier becomes active, driving current into the load. Through the impedance-inverting action of the quarter wavelength transmission line, this decreases the effective impedance at the output of the main amplifier, such that the main amplifier is kept at a constant (peak) voltage above the transition point. The result is a substantially linear output to input power relationship, with a significantly higher efficiency than a traditional amplifier.

The transition point can be shifted, so that the auxiliary amplifier kicks in at a lower or higher power level. This can be used for increasing efficiency for a specific type of signal or a specific amplitude distribution. When the transition point is shifted, the power division between the amplifiers at peak power is shifted accordingly, and the average power loss in each amplifier also changes. The latter effect also depends on the specific amplitude distribution.

The Doherty concept has also been extended to multi-stage (more than one auxiliary amplifier) variants [1, 4, 5]. This allows the efficiency to be kept high over a broader range of output power levels and varying amplitude distributions. Alternatively, the average efficiency for a specific amplitude distribution and a specific power level can be made higher.

The original Doherty amplifier used a quarter wavelength transmission line coupled directly between the outputs of the two amplifiers. However, state of the art RF power transistors require a very low load impedance, which means that the quarter wavelength transmission line for the original Doherty configuration also has to be designed at a correspondingly low impedance. A solution for this problem is given in [3] and [6] and used in [7]. This solution places the impedance inverter between higher impedance points, obtained through single or multiple quarter wavelength impedance transformers.

The Doherty amplifiers are known to be non-linear, and to have a linearity "inversely proportional to their efficiency" [7], especially outside a narrow frequency band. Attempts have been made to reduce the distortion and increasing the useful bandwidth by paralleling multiple Doherty amplifiers with different impedance inverter center frequencies, different bias for the auxiliary amplifiers and different matching structures, in order to "randomize" the inter-modulation products as much as possible [7]. This technique also involves complicated trimming of bias levels.

Detailed analysis shows that a Doherty amplifier, even when made from ideal components, is non-linear for all but very narrow frequency bands. The results further show that losses, that would not affect linearity in a regular class B, A or AB amplifier, cause severe non-linearity in a Doherty amplifier. Furthermore, losses can decrease efficiency more in a Doherty amplifier than a regular amplifier (although the resultant efficiency is still higher for the Doherty), since they can cause the main amplifiers to work non-optimally in addition to just adding losses. A more detailed discussion of these effects will be given below.

Another important feature is that Doherty amplifiers are inherently band-limited, since the impedance inverting network only provides 90 degrees of phase shift at a single frequency. This band-limiting has several effects.

One important effect is that the output is distorted at frequencies away from the center frequency. This effect, which severely limits the use of the Doherty amplifier in wideband linear applications, is due to the growing (chiefly reactive in the lossless case) impedance of the quarter wavelength network at frequencies away from the center frequency. This distortion is present even if all components are linear and lossless, since it is due to the reflection (because of the non-zero impedance) of the non-linear current from the auxiliary amplifier at the impedance inverter. The resulting voltage shows up as a strongly frequency-dependent non-linear component in the amplified output signal.

Another effect is that the Doherty principle, i.e. the suppression of RF voltage rise at the main amplifier above a certain transition point, works poorly outside a limited frequency band. This is because the suppression requires the voltages from the main amplifier and the auxiliary amplifier to be in perfect anti-phase at the output of the main amplifier. Since the quarter-wave network is really only a quarter wave (90 degrees) phase shift at the center frequency, and shorter or longer at frequencies below and above the center frequency, respectively, this requirement gets more and more violated the further one gets from the center frequency of the impedance inverter.

Furthermore, the output signal is bandpass filtered through reflections from the quarter-wave network.

Losses in the transistors, impedance inverters and the DC feed networks also give rise to unexpected distortion. This is because these losses make the impedance at the impedance inverter, as seen from the auxiliary amplifier, resistive instead of the ideal short-circuit (a lossless quarter wavelength transmission line loaded with the infinite impedance of a current generator is a short-circuit at center frequency). A finite resistance at the output of the main amplifier, as well as losses in the quarter-wave network will cause distortion. The distortion in the output caused by these losses are due to the same type of reflection (but now resistive instead of reactive) of the non-linear current from the auxiliary amplifier at the impedance inverter which causes the frequency-dependent distortion mentioned earlier.

Losses will also possibly further decrease efficiency, since the voltage at the main amplifier will not be at its maximum at output levels above the transition point. By providing more current from the main amplifier, this problem can be reduced. The voltage at the main amplifier will then instead be governed by saturation, which will lead to non-linearity in the output. By carefully adjusting the transition point and output current from the auxiliary amplifier (by adjusting the bias level and gain of the drive signal) the output can again be made more linear (at least decreasing the amplitude distortion). This last effect is due to the increased impedance at the output of the auxiliary amplifier, which makes the auxiliary amplifier contribute more voltage to the output for each unit of current provided. The trimming method just described only works in a narrow band and is not easily reproducible since it involves using the saturation non-linearity, whose exact shape now becomes important. Due to non-linear coupling to generated overtones it can also give a high and unpredictable AM–PM distortion.

The non-linear characteristic of the regular Doherty amplifier built and optimized with the techniques mentioned is highly complex. It is a non-linearity whose AM—AM and AM–PM distortion varies strongly with frequency and has a frequency (filter) characteristic that varies non-linearly with amplitude. This makes it very difficult to compensate for by applying pre-distortion. Since the pre-distorter would have to be very complex (and hence implemented with digital signal processing techniques), and a pre-distorter has to have a rather wide bandwidth compared to the already distortion-widened signal it should compensate for (since the inverse function to the distortion function is of higher order than the distortion function itself, such a pre-distorter would be hard to build even for moderately wideband signals.

The conclusion is that the current way of building Doherty amplifiers can only provide reasonable linear performance and efficiency in a narrow band, and this only by relying on saturation effects in the main amplifier. Furthermore, the nonlinear characteristic is not easily compensated for in a wide band by using pre-distortion.

SUMMARY

An object of the present invention is to enhance linearity of a composite amplifier provided with a Doherty output network, preferably over a broad frequency band.

This object is achieved in accordance with the attached claims.

Briefly, the present invention subtracts a non-linear function of the input signal, which emulates the non-linear auxiliary amplifier output current, from the main amplifier drive signal. This has the advantage of canceling the non-linear components in the output without sacrificing amplifier efficiency.

The non-linear function can be obtained from a model of the auxiliary amplifier current function (if the auxiliary amplifier is producing the non-linear current by working in class C), or can be produced beforehand and used, in amplified form, both as the drive signal for the auxiliary amplifier (which then can be biased for linear class B or AB operation) and for cross-coupling through the filter.

BRIEF DESCRIPTION OF THE DRAWINGS

The invention, together with further objects and advantages thereof, may best be understood by making reference to the following description taken together with the accompanying drawings, in which.

DETAILED DESCRIPTION

The basic principles of the present invention will now be described with reference to FIG. 1–4.

Figure 1:
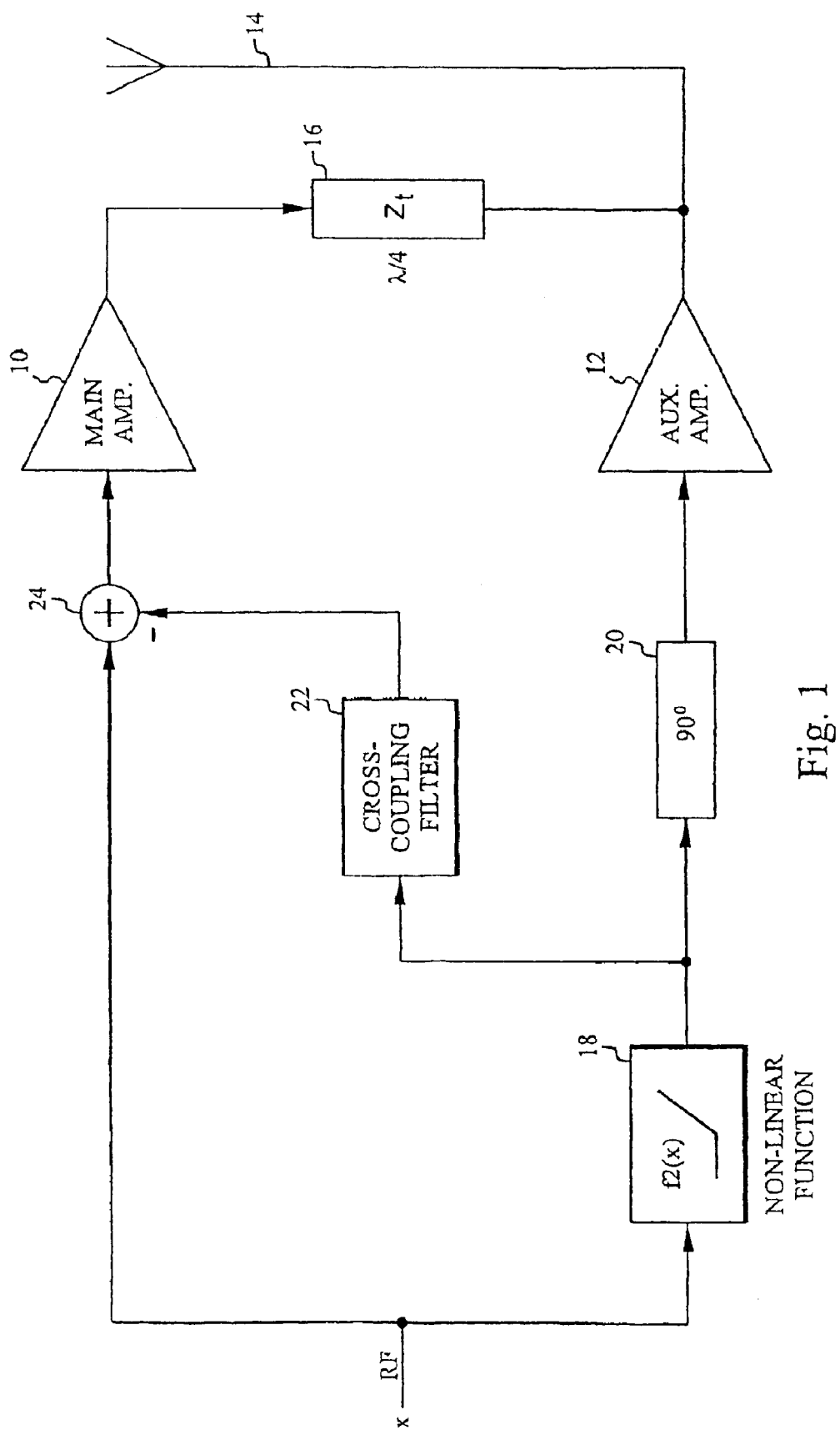
FIG. 1 is a simplified block diagram of an exemplary embodiment of the composite amplifier in accordance with the present invention.

FIG. 1 is a simplified block diagram of an exemplary embodiment of the composite amplifier in accordance with the present invention. This embodiment illustrates the basic principles of the present invention. It includes a main power amplifier 10 and an auxiliary power amplifier 12. The output of auxiliary amplifier 12 is connected directly to a load (antenna) 14, whereas the output of main amplifier 10 is connected to the output of auxiliary amplifier 12 over a Doherty output network including a quarter wavelength transmission line 16. On the input side an RF (Radio Frequency) input signal x is divided into two branches, one branch intended for main amplifier 10 and another branch for auxiliary amplifier 12. The auxiliary amplifier branch includes a non-linear function block 18, which transforms input signal x into f2(x), and a phase shifter 20, which shifts the input signal to auxiliary amplifier 12 by 90 degrees. Elements 22 and 24 will be described below. As indicated by antenna 14 the composite amplifier may be part of a transmitter, for example a transmitter in a base station in a cellular mobile radio communication system.

Figure 2:
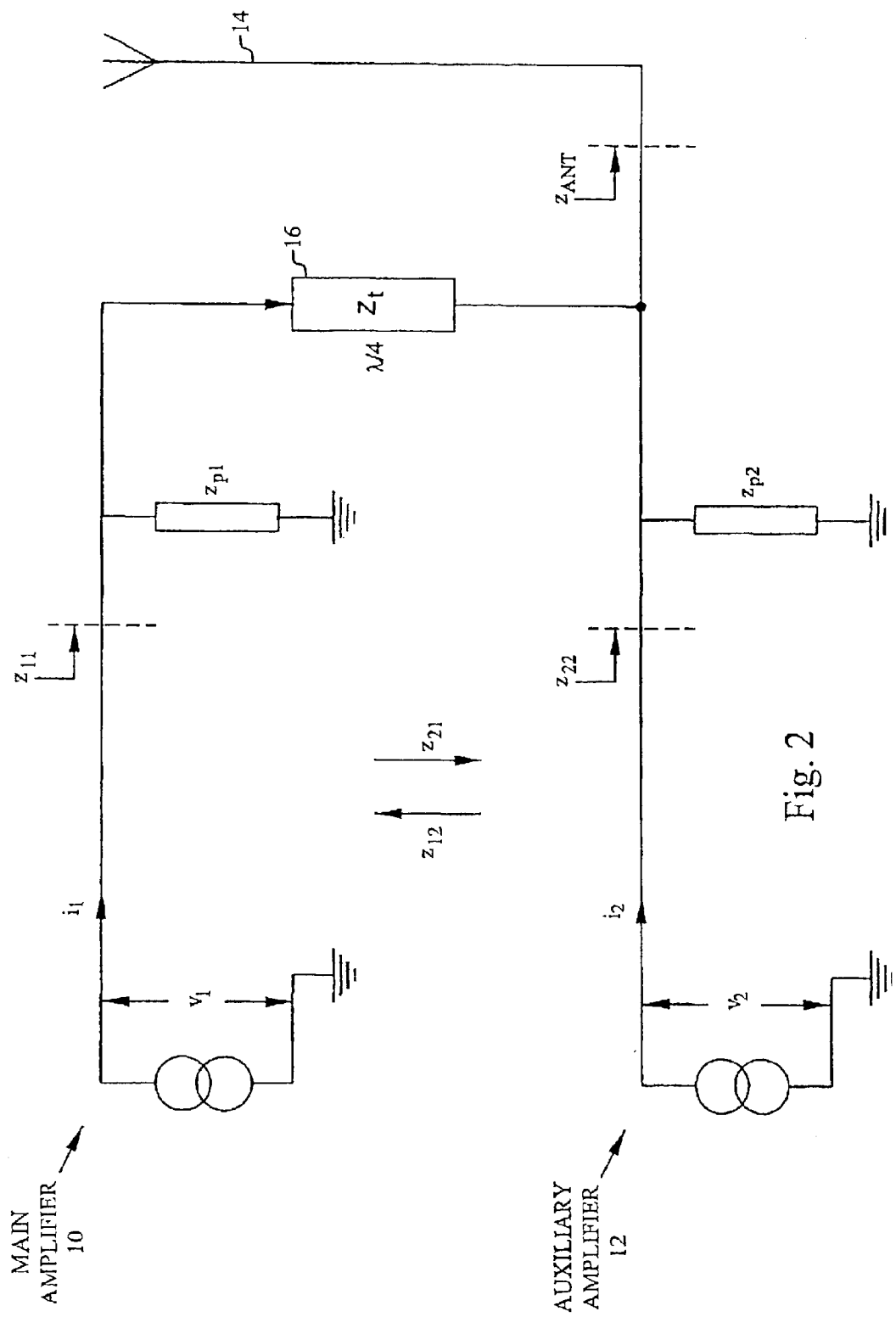
FIG. 2 is a model of the output network of a Doherty amplifier.
Figure 3:
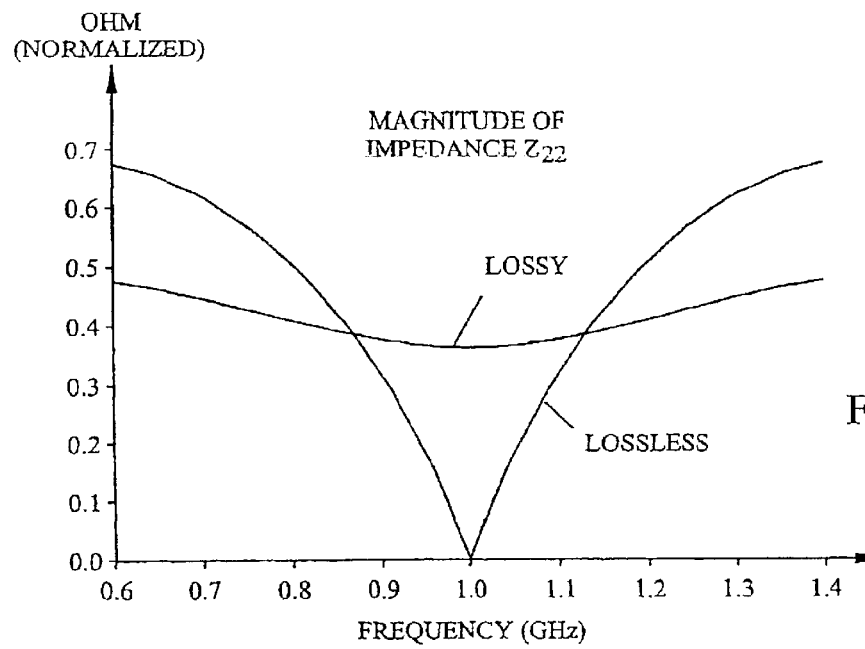
FIG. 3 a diagram illustrating the frequency dependence of the impedance seen by the auxiliary amplifier output.
Figure 4:
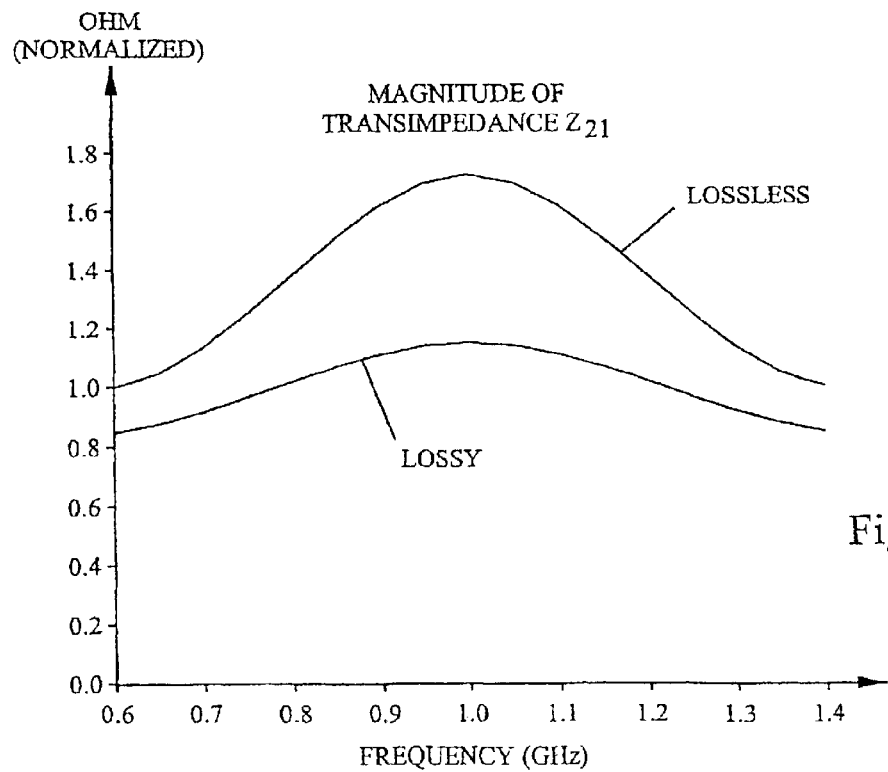
FIG. 4 is a diagram illustrating the frequency dependence of the trans-impedance between the main and auxiliary amplifier.

FIG. 2 is a model of the output network of a Doherty amplifier. In this model the active part of the amplifier transistor outputs are modeled as linear controlled current generators. The finite output conductances of the transistors, together with possible reactances, are lumped together as $z_{p1}$ and $z_{p2}$, respectively. The impedances presented to each current generator output node are defined as:

$$z_{11} = \frac{v_1}{i_1}\bigg|_{i_2=0} \qquad z_{22} = \frac{v_2}{i_2}\bigg|_{i_1=0}$$

Similarly, the transimpedances, i.e. the voltage at the inactive amplifier output in response to an output current at the active amplifier, are defined as:

$$z_{21} = \frac{v_2}{i_1}\bigg|_{i_2=0} \qquad z_{12} = \frac{v_1}{i_2}\bigg|_{i_1=0}$$

Assuming that all components are reasonably linear, superposition can be used for analyzing this model. The composite amplifier output voltage (at the antenna) is here assumed to be the same as the output voltage at auxiliary amplifier 12, although in reality there can be a feeder cable, filters, etc. separating the actual antenna and the amplifier output. The combined effect of all these elements is included in the antenna (output) impedance, ZANT.

In an ideal Doherty amplifier, the impedance $z_{22}$ is zero, i.e. a current excitation from auxiliary amplifier 12 does not cause a voltage in the output. This is because a quarter wavelength transmission line terminated with an infinitely high impedance transforms into a short circuit. For a practical Doherty amplifier, however, this impedance has a non-zero resistive part and a strongly frequency-dependent reactive part. The resistive part (which is also frequency-dependent) stems from the transformed, finite output conductance of main amplifier 10. The reactive part comes partly from possible reactive components of $z_{p1}$, as well as the transformed $z_{p2}$ and ZANT. Even without these reactances, however, there is a frequency-dependent reactive part due to the quarter-wave transformer, which is only a perfect quarter wavelength at a single frequency. A comparison of the $z_{22}$ magnitude (normalized to an optimal load resistance of 1 ohm) for the (ideal) lossless case and with large losses (both in the quarter wavelength transmission line and transistor output conductance) is given in FIG. 3. The design frequency is 1 GHz and the reactive part dominates from 800 MHz to 1.2 GHz in the lossless case. The resistive part dominates in the lossy case. The transimpedances $z_{21}$ and $z_{12}$ (which are equal, due to the Reciprocity Theorem) are also affected by losses in that the transmission, i.e. magnitude of the voltage at the opposite terminal for a given current stimulus, is lowered. This effect can be seen in FIG. 4.

The non-zero impedance $z_{22}$ will "reflect" any current $i_2$ from auxiliary amplifier 12 as a voltage, and this voltage will be found in the output. If $i_2$ were a linear representation of the desired signal, this would not be a problem. However, in Doherty and similar amplifiers, this current is a very non-linear function of the desired signal (due to function f2(x)). The non-ideal impedance $z_{22}$ thus makes the amplifier output non-linear.

The idea of the present invention is to cross-couple a copy of this non-linear signal ($i_2$ filtered by impedance $z_{22}$) to main amplifier 10 in anti-phase, to effectively cancel the distortion at the output. Since the transimpedance $z_{21}$ is the main linear channel from main amplifier 10 to the output, the compensation to the input of main amplifier 10 will linearly transform (slightly filtered by $z_{21}$) into a cancellation signal in the output. The cross-coupled compensation signal must therefore itself be compensated for the filtering effect of transimpedance $z_{21}$ for everything to cancel perfectly. Thus, a cross-coupling filter 22 in FIG. 1 may be represented by:

$$z_{22} * z_{21}^{-1}$$

where "*" denotes multiplication in the frequency domain or convolution in the time domain. The cross-coupled signal is subtracted from the input signal to main amplifier 10 in an element 24. In a digital implementation element 24 is an adder, in an analog implementation it may be realized as a hybrid.

Figure 5:
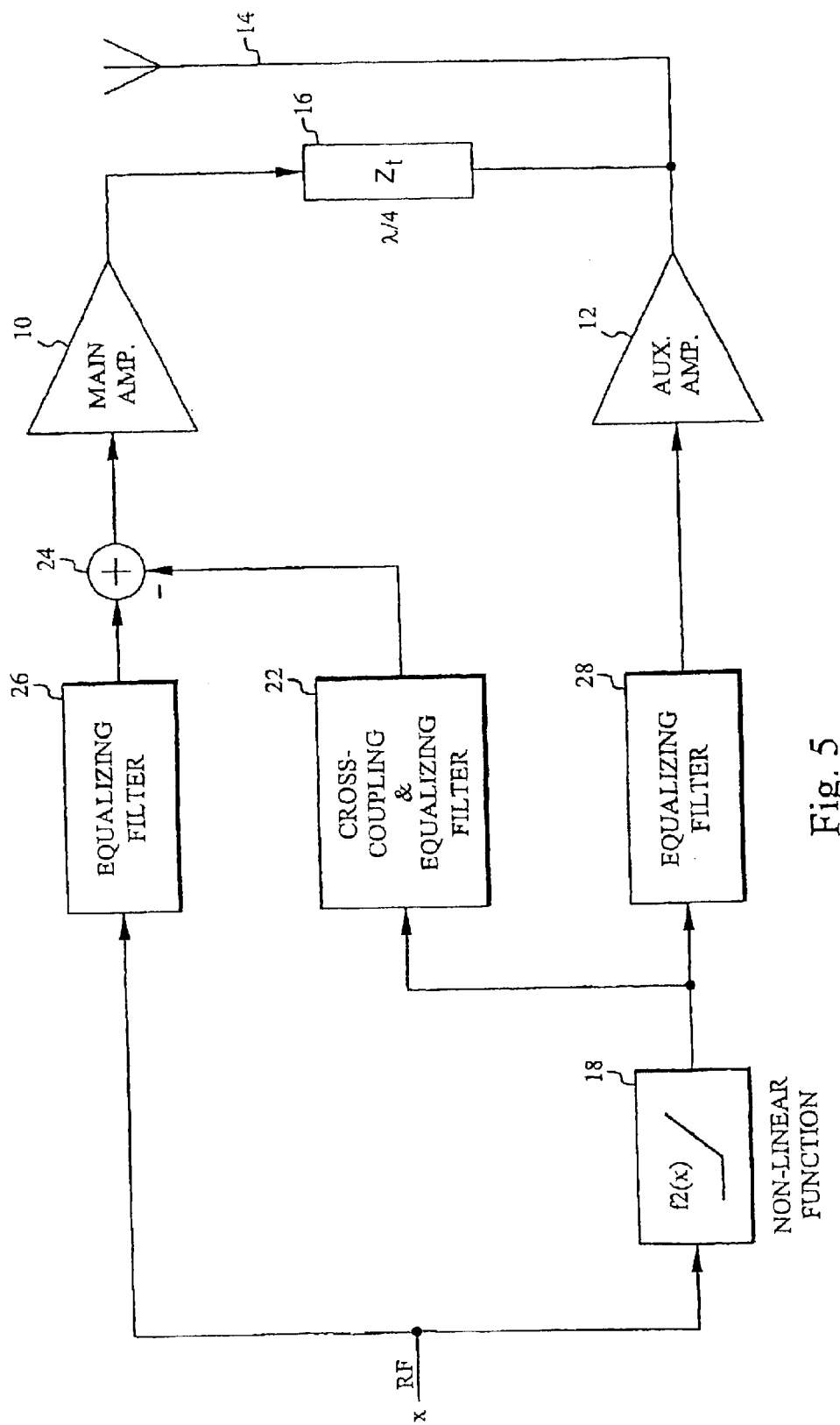
FIG. 5 is a simplified block diagram of another exemplary embodiment of the composite amplifier in accordance with the present invention.

Having described the basic principle of the invention, an embodiment with an equalized frequency response will now be described with reference to FIG. 5-7.

Since the primary function of auxiliary amplifier 12 in a Doherty amplifier is to keep the voltage at main amplifier 10 below saturation, the frequency dependence of all signals at the output of main amplifier 10 should be as flat as possible. For the linear component (which constitutes all of $i_1$ of an uncompensated amplifier) this is achieved by filtering at the input by a filter with the frequency characteristics of $z_{11}^{-1}$, the inverse filter of the impedance seen at the output of main amplifier 10.

For the non-linear component due to $i_2$, which is filtered through the transimpedance $z_{12}$, and the non-linear part of $i_1$ that represents the cross-coupled distortion-canceling signal, which is filtered by $z_{11}$, the total should have a flat frequency characteristic (not just in magnitude, but also in phase). Since the non-linear component is formed by two parts, which are differently filtered, and the requirement for distortion-cancellation at the output dictates a certain relationship between the frequency characteristics of these signals, they should both be additionally filtered by the inverse of a special composite filter. Assuming that the raw non-linear function $f2(x)$ has been filtered by $z_{22}*z_{21}^{-1}$ for the cross-coupled part of $i_1$ and by nothing for the auxiliary amplifier 12 part (except for gain), the total non-linear part is represented by:

$$\underbrace{f2(x)*z_{12}}_{i_2 \text{ part}} - \underbrace{f2(x)*z_{22}*z_{21}^{-1}*z_{11}}_{\text{cross-coupled part}} = f2(x)*\underbrace{(z_{12} - z_{22}*z_{21}^{-1}*z_{11})}_{\text{composite filter}}$$

Thus, the extra equalizing filtering to these signals should have a frequency response as:

$$(z_{12} - z_{22}*z_{21}^{-1}*z_{11})^{-1}$$

So far, nothing has been said about the magnitudes of the currents and voltages in the system except for their relation to each other. For the lossless case and at (near) the center frequency of the quarter-wave line, the traditional Doherty equations suffice. For extracting the most power from the chosen transistors, at least one of the transistors should be operating at its maximum current $I_{max}$. The voltages at peak power should also be the maximum allowed voltage $V_{max}$ (possibly with a safety margin). For a class B amplifier, the optimal load $R_{opt}$ is $V_{max}/I_{max}$. For an ideal Doherty amplifier the optimal load impedance depends on the transition point $\alpha$, such that $R_o = R_{opt}(1-\alpha)$.

For transition points $\alpha$ below 0.5, the current $i_1$ should in the ideal lossless, narrowband case vary linearly with the signal amplitude and be equal to $I_{max}(1-\alpha)$ at the peak amplitude. Current $i_2$ should instead be zero for output voltages below the transition point, and above the transition point vary as the (normalized) amplitude minus $\alpha$ divided by $(1-\alpha)$. This means that auxiliary amplifier 12 delivers current $I_{max}$ at peak amplitude. For transition points above 0.5 (which is very unlikely for optimized multi-carrier cases), $i_1$ would instead amount to $I_{max}$ at peak amplitude, and $i_2$ would maximally be $I_{max}(1-\alpha)/\alpha$.

The procedure for the lossy, wideband case is more involved. The limitations for the currents and voltages are the same as for the narrowband lossless case, but the statistical nature of the wideband signals makes it hard to obtain analytical expressions for them. The voltages will then depend on the bandwidth used, the amplitude distribution and phase relations of the individual carriers of the signal. The lossy, narrowband case can however provide a starting point, from where adjustments can be made for the specific signals encountered.

In the lossy case the filter for obtaining the linear part of $i_1$, as applied to the dimensionless input signal x, will be $V_{max}/\alpha * z_{11}^{-1}$. The physical meaning of this filter is to generate the current $i_1$ such that the voltage at the output of the current generator of main amplifier 10 reaches $V_{max}$ at the normalized input amplitude $\alpha$ when the impedance seen by this current generator is $z_{11}$. The term $z_{11}^{-1}$, the inverse filter of the impedance $z_{11}$, is when observed in the frequency domain equal to $1/z_{11}$.

The filters applied to the non-linear function $f2(x)$ also have the dimension of current. In practice this is achieved by generating the appropriate drive voltage to the transistors, which act as transconductances, so that the end result is the desired current output. The filter applied to $f2(x)$ for obtaining $i_2$ is in the lossless case without frequency compensation simply a multiplication by $j*I_{max}$ (90 degrees phase shift). The maximum amplitude of the function $f2(x)$ is here assumed equal to one. The cancellation term is then $f2(x)$ filtered by $-j*I_{max}*z_{22}*z_{21}^{-1}$. The compensation $(z_{12} - z_{22}*z_{21}^{-1}*z_{11})^{-1}$ for achieving a frequency-independent non-linear voltage at main amplifier 10 can be multiplied to these two expressions in normalized and dimensionless form.

The expression for obtaining the linear part of $i_1$ already compensates for losses. The expressions for the non-linear parts must be modified to do so. Since the relation between the two non-linear currents is already established, this is achieved by modifying the magnitude (gain) of both parts equally, so that the amplitude of the suppression voltage at main amplifier 10 has the same slope as the linear part. The factor to multiply with is $V_{max}/\alpha$ divided by $(z_{12} - z_{22}*z_{21}^{-1}*z_{11})*j*I_{max}/(1-\alpha)$. The numerator and denominator are the voltage rise per normalized amplitude for the voltage at main amplifier 10 due to the linear part of $i_1$ and the non-linear currents, respectively. The denominator represents the voltage rise when the current magnitude derived for the narrowband, lossless case is used. One thing to note here is that the compensation $(z_{12} - z_{22}*z_{21}^{-1}*z_{11})^{-1}$ for achieving a frequency-independent non-linear voltage at main amplifier 10 is automatically included in this "new" compensation. Thus, in hindsight the normalization is actually not necessary.

The analytical expressions for obtaining $i_2$ and $i_1$ are thus:

$$i_2 = \frac{V_{max}(1-\alpha)}{\alpha}(z_{12} - z_{11}*z_{22}*z_{21}^{-1})^{-1} * f2(x)$$

$$i_{1,\text{nonlinear part}} = -\frac{V_{max}(1-\alpha)}{\alpha}\underbrace{(z_{12} - z_{11}*z_{22}*z_{21}^{-1})^{-1}}_{\text{Equalizing part}} * \underbrace{z_{22}*z_{21}^{-1}*f2(x)}_{\text{Distortion-cancelling part}}$$

$$i_{1,\text{linear part}} = \frac{V_{max}}{\alpha}z_{11}^{-1} * x$$

As previously, if the dimensionless signals $f2(x)$ and x are represented in the time domain, "*" represent convolution in the time domain. If they are represented in the frequency domain, the symbol instead represents multiplication of frequency responses, and the multiplication with inverse filters can be written as a division by the filter instead. The j and −j factors have vanished from the expressions, but in reality the phases of the currents are about the same as before. What has happened is that the imaginary units are embedded into the $(z_{12} - z_{22}*z_{21}^{-1}*z_{11})^{-1}$ factors. Since $z_{12}$ (the largest part of the expression, at least near the center frequency) mainly represents the transformation of a current into a voltage over a quarter-wave line, this entails a 90° phase shift at the center frequency. The derived network model is shown in FIG. 5. Filters 22, 26 and 28 may thus be represented by:

Filter 28: $\frac{V_{max}(1-\alpha)}{\alpha}(z_{12} - z_{11}*z_{22}*z_{21}^{-1})^{-1}$ Filter 22: $\frac{V_{max}(1-\alpha)}{\alpha}(z_{12} - z_{11}*z_{22}*z_{21}^{-1})^{-1} * z_{22}*z_{21}^{-1}$ Filter 26: $\frac{V_{max}}{\alpha}z_{11}^{-1}$ So far only the optimization of the voltage at main amplifier 10 and distortion cancellation in the output have been studied, and expressions for the optimal currents have been derived. The voltage amplitude at auxiliary amplifier 12 has been left out of the discussion. This is partly because a fixed hardware setup has been assumed, i.e. the impedance of the quarter wave line and the load has been assumed fixed. For a lossless system this is not a serious problem, the effect of optimizing for flat response and optimal amplitude at main amplifier 10 is that the output signal gets a slight frequency dependence. When losses are considered, however, the effect can be that the maximum voltage at auxiliary amplifier 12 never reaches $V_{max}$, even at maximum input levels. This constitutes a more serious problem, since the transistors then deliver less than the maximum power to the load (at peak output), while still having the same supply voltage, and the efficiency will drop. The simple solution is to either reduce the supply voltage, or to increase the load impedance until maximum voltage is achieved at peak output (the latter solution is preferred, since this scheme gives higher efficiency and more available output power). The compensation for losses can also have the effect that neither transistor reaches $I_{max}$, which also implies an under-utilization of the transistors. Impedances (load and quarter-wave line) may then have to be changed in order to use the maximum possible output power from the transistors. Equally important is to keep both transistors in the safe region, so that the maximum currents and voltages are reached but not exceeded. Note that when changing the impedances in the circuit, redesign of the compensations according to the depicted scheme is necessary. Also, if maximum power is not a design goal, the circuit can be optimized differently, to meet other objectives.

Figure 6:
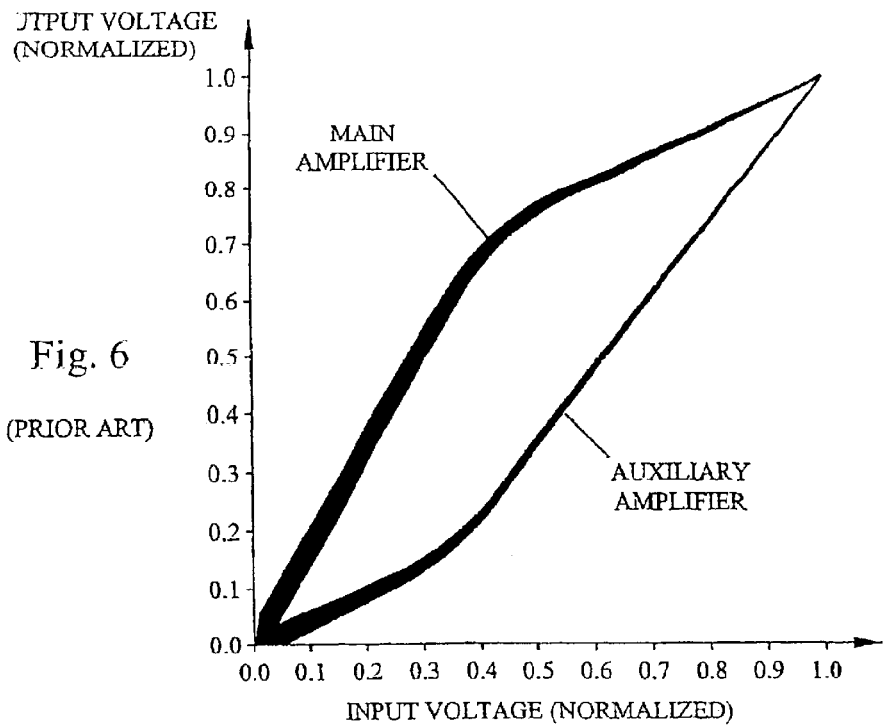
FIG. 6 is a diagram illustrating the input-output voltage characteristics of a prior art Doherty amplifier.
Figure 7:
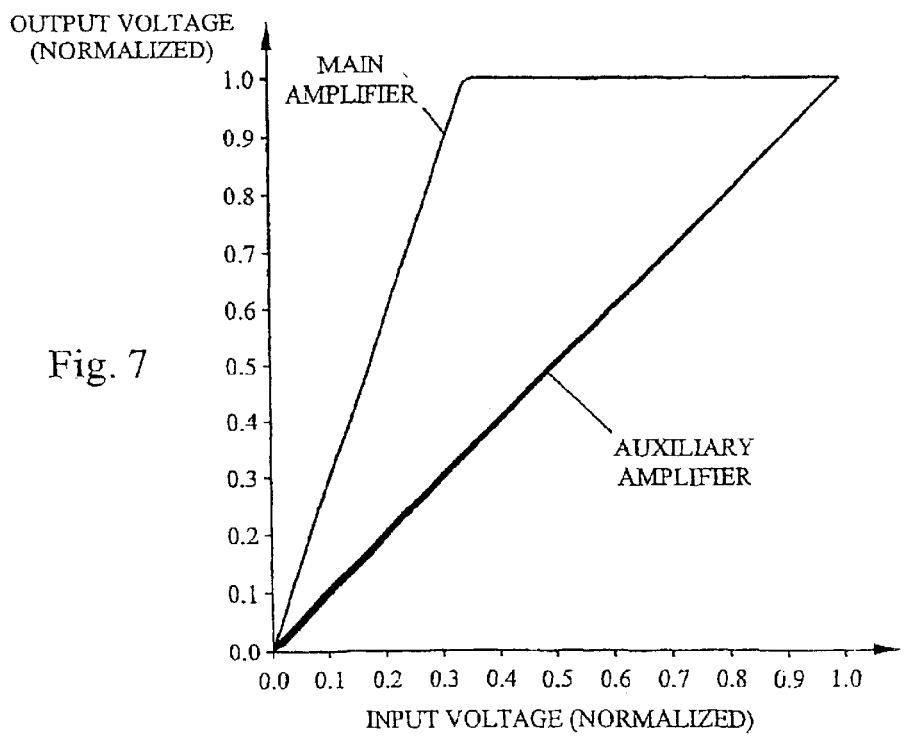
FIG. 7 is a diagram illustrating the input-output voltage characteristics of a composite amplifier in accordance with the present invention.

The effect of the compensation in accordance with the present invention is illustrated in FIGS. 6 and 7 with reference to a simulated example with a multi-carrier signal. The signal consists of nine carriers within 80 MHz bandwidth centered on 1 GHz.

In this example, losses are present both as losses in the quarter wave transmission line and as conductive losses at the outputs of the transistors. In FIG. 6 the normalized magnitudes of the voltages at main amplifier 10 and auxiliary amplifier 12 are plotted against the desired magnitude (the normalized amplitude of x) for the uncompensated case (prior art). The drive signals have been adjusted to keep both voltages within the linear (unsaturated) range of the transistors. The different slopes of the output signal (voltage at auxiliary amplifier 12) below and above the transition point indicate a static non-linearity. The different widths of these curves indicate a level-variant frequency dependence. The voltage at main amplifier 10 is not at all close to the desired constant level above the transition point, which means that the average efficiency will be low (although still probably better than for a class B amplifier).

The normalized magnitudes of the voltages at main amplifier 10 and auxiliary amplifier 12 after distortion-canceling and efficiency-boosting cross-coupling in accordance with the present invention are illustrated in FIG. 7. Compensation of the network for losses has been performed by changing the transmission line impedance and the load impedance. The output voltage can be seen to be linear, and the voltage at main amplifier 10 clearly is close to optimal for efficiency. The widened lines are for both voltages due to bandwidth restrictions, for the linear part due to the Doherty network and for the non-linear parts due to the simulated bandwidth of about 400 MHz.

Sometimes the optimal load impedances of the transistors are much different from the impedances available for the quarter-wave line and load. The transistors are often also packaged, which means that the current-source output is only available indirectly. A Doherty amplifier can still be made, by moving the quarter-wave line to a point one or two quarter wavelengths from the transistor by appropriate matching networks [3, 6, 7].

Figure 8:
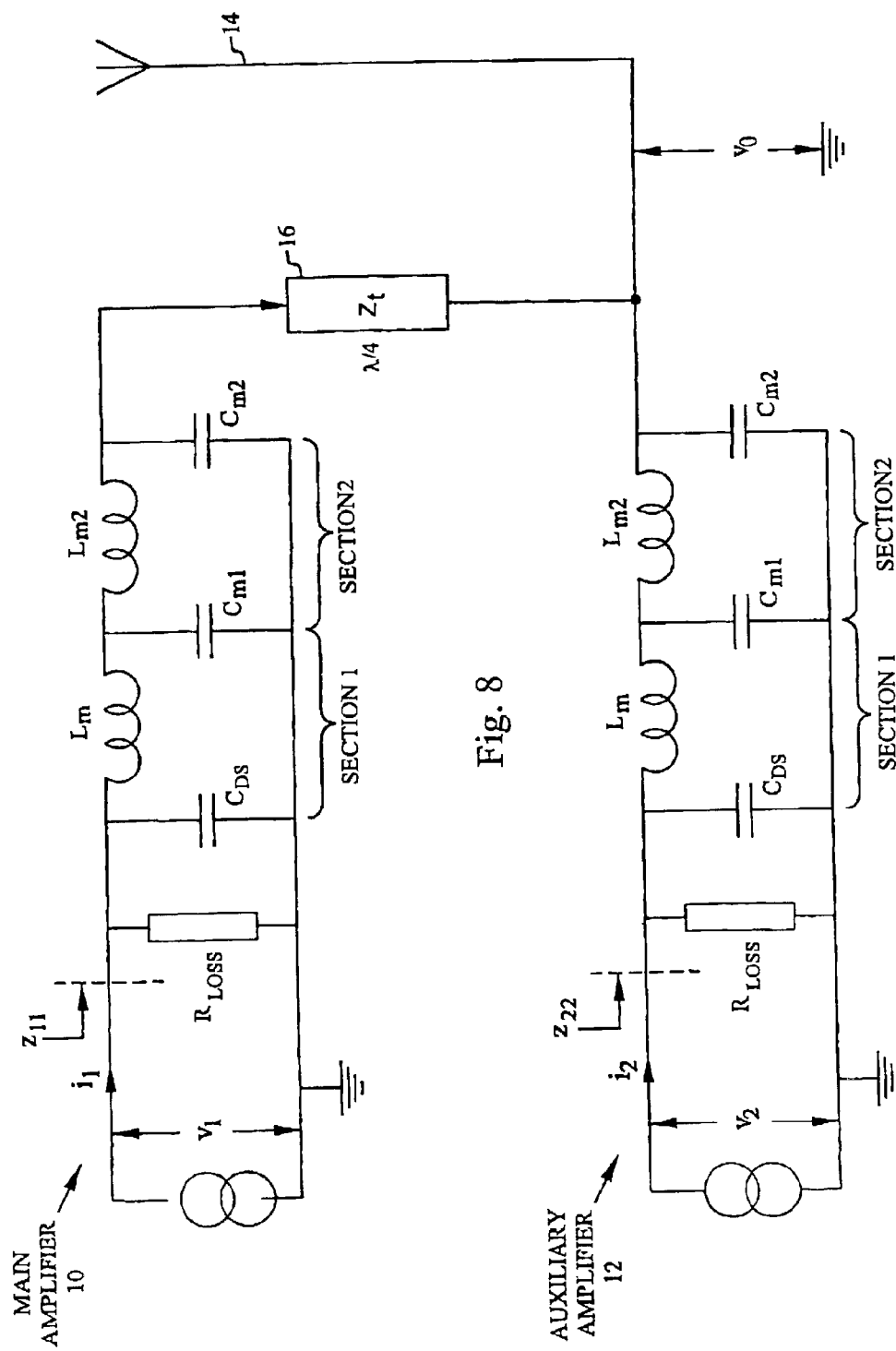
FIG. 8 is a block diagram of a Doherty output network with LDMOS transistors and matching to 50 ohms.

An example of a modified Doherty network employing Laterally Diffused Metal Oxide Semiconductor (LDMOS) Field Effect Transistors (FETs) is shown in FIG. 8 (for the purposes of this application, such an output network will still be considered as a Doherty output network). It consists of two-stage matching networks closest to the transistors and the regular quarter-wave line outside the matching networks. Each matching network consists of two pi-matching sections in which the capacitor $C_{m1}$ is a part of both the first and second, possibly symmetrical, sections. The usually very large output capacitance $C_{DS}$ of the LDMOS transistor implies that the matching section closest to the transistor has a very low impedance. The second section transforms the system impedance, usually in the order of 50 ohms, down to this level. The matching can be made equal for both branches, if a quarter-wave line can be made that has the appropriate impedance $Z_t$. Alternatively different matching networks can be used depending on which load and transmission line impedances are available.

The modified Doherty network in FIG. 8 has three nodes worth analyzing. The design of the cross-coupling distortion-cancellation signal in this case starts by identifying how RF currents from the node of main amplifier 10 and the node of auxiliary amplifier 12 transform into voltages at the output node. This yields a relation between the cross-coupled part and the "direct" part, such that the cross-coupled part should have an extra filter of $-z_{o2}*z_{o1}^{-1}$, where:

$$z_{02} = \frac{v_0}{i_2}\bigg|_{i_1=0} \qquad z_{01} = \frac{v_0}{i_1}\bigg|_{i_2=0}$$

The linear part of current $i_1$ is also for the modified networks determined from the expression $x*V_{max}/\alpha*z_{11}^{-1}$ which gives the gain and filter characteristics of this part.

The "filter factor sum" $(z_{12}-z_{o2}*z_{11}*z_{o1}^{-1})$ of the non-linear voltages at the current generator output of main amplifier 10, and the "equal slope" criterion, give the full expressions for the direct and cross-coupled filters. The procedure is similar to the one derived for the simple Doherty network, except that the new transimpedances $z_{o2}$ and $z_{o1}$ are used instead of $z_{22}$ and $z_{21}$. Something to note, especially for the modified networks, is that the narrow bandwidth can cause problems for the cancellation operation. Since $(z_{12}-z_{o2}*z_{11}*z_{o1}^{-1})$ can have zeros not very far from the center frequency, the inverse of this filter, which is applied to the non-linear components of the currents, will have infinitely high amplitude at these points. The compensation (and hence the bandwidth of the non-linear signals) must therefore be limited to a sufficiently narrower bandwidth than these "compensation poles". Except for these considerations, the analytical expressions for obtaining $i_2$ and the cancellation term of $i_1$ for the fully compensated modified Doherty amplifier are:

$$i_2 = \frac{V_{max}(1-\alpha)}{\alpha}(z_{12} - z_{11}*z_{02}*z_{01}^{-1})^{-1} * f2(x)$$

$$i_{1,\text{nonlinear part}} = -\frac{V_{max}(1-\alpha)}{\alpha}\underbrace{(z_{12} - z_{11}*z_{02}*z_{01}^{-1})^{-1}}_{\text{Equalizing part}} * \underbrace{z_{02}*z_{01}^{-1}*f2(x)}_{\text{Distortion-cancelling part}}$$

$$i_{1,\text{linear part}} = \frac{V_{max}}{\alpha}z_{11}^{-1} * x$$

The voltage at auxiliary amplifier 12 will have a different frequency dependence for the linear and non-linear parts. It is however not necessary to compensate for this, as long as the maximum voltages and currents are not exceeded, since auxiliary amplifier 12 is not the output node. The guidelines described in conjunction with the simple Doherty amplifier, about maximizing the available power by reaching the maximum (safe) currents and voltages but not exceeding them, hold also for the modified Doherty amplifier. The recipe is the same; change load and transmission line impedances until most voltages and currents reach their maximum values at some point of the desired amplitude range.

A multi-stage Doherty amplifier presents yet another challenge, since even more nodes are present in the system. The distortion should be minimal at the output and efficiency boosting should ideally optimize the voltage levels above transition points for several (all except the last one) amplifiers. The basic rules developed earlier still apply, but trade-offs may be necessary to get the best overall result. A multi-stage composite amplifier operating in accordance with the principles of the present invention will now be described with reference to FIG. 9–11.

The main characteristic of multi-stage Doherty amplifiers is that they have more than one amplifier (current generator) coupled with high transmission (transimpedance) to the output. This means that for linear operation (i.e. without saturation or limiting effects), the linear output voltage even in an ideal multistage Doherty amplifier is composed of two or more non-linear parts coming from different amplifiers.

Two special arrangements are necessary for achieving linear output. Firstly, the non-linear signals that are used for depressing the voltage at the previous (one lower transition point) amplifier must at the output be cancelled by a similarly filtered non-linear signal from an amplifier with a high transimpedance to the output, usually the previous amplifier itself. Secondly, the non-linear parts that together make up the linear output must have equal frequency dependence and gain, as seen at the output.

The current generators that have high transmission to the output also have high transmission to each other. This effect is as important for keeping the lower power amplifiers at constant voltage above transition points as the proper "Doherty effect".

Figure 9:
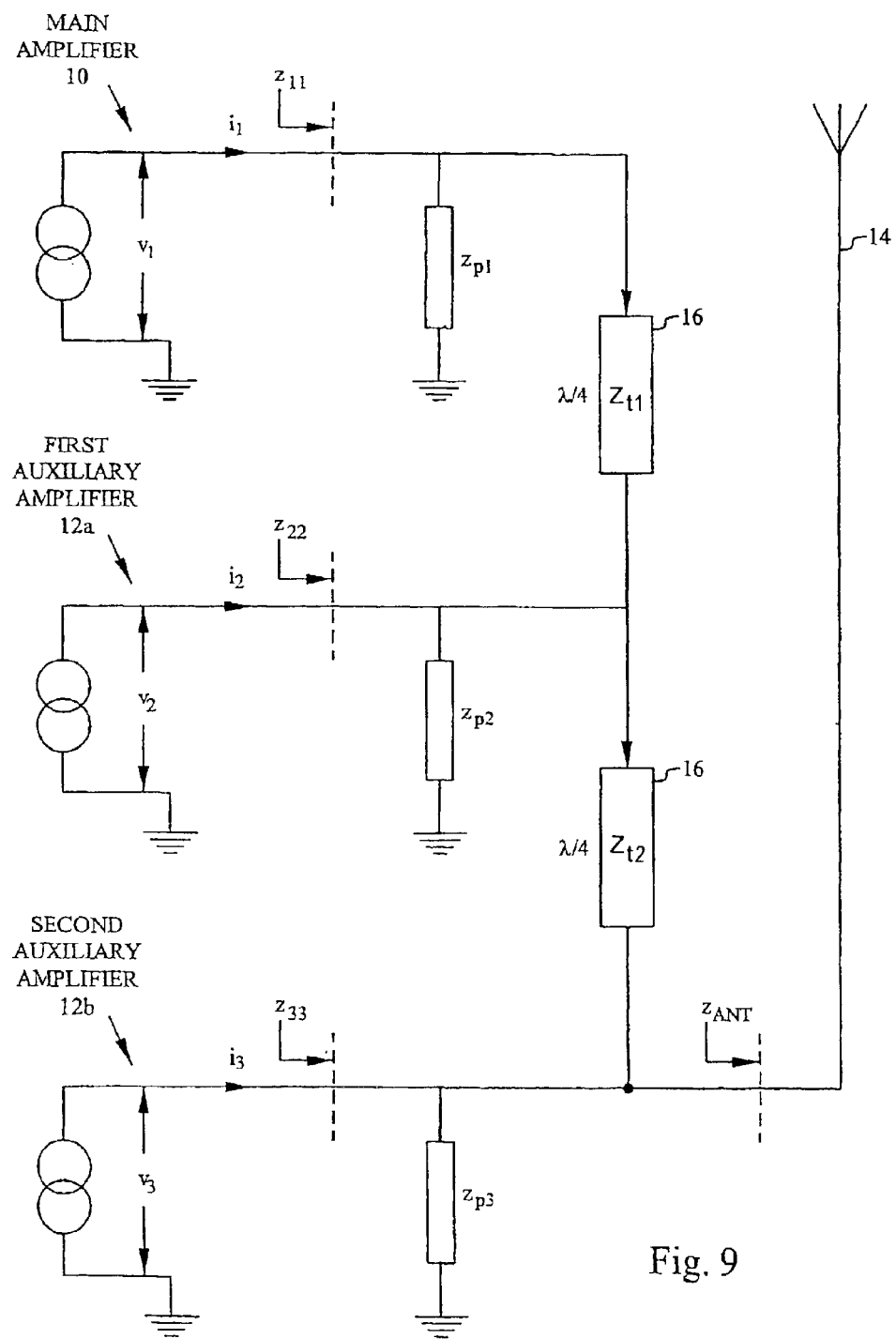
FIG. 9 is a model of the output network of a multi-stage Doherty amplifier.
Figure 10:
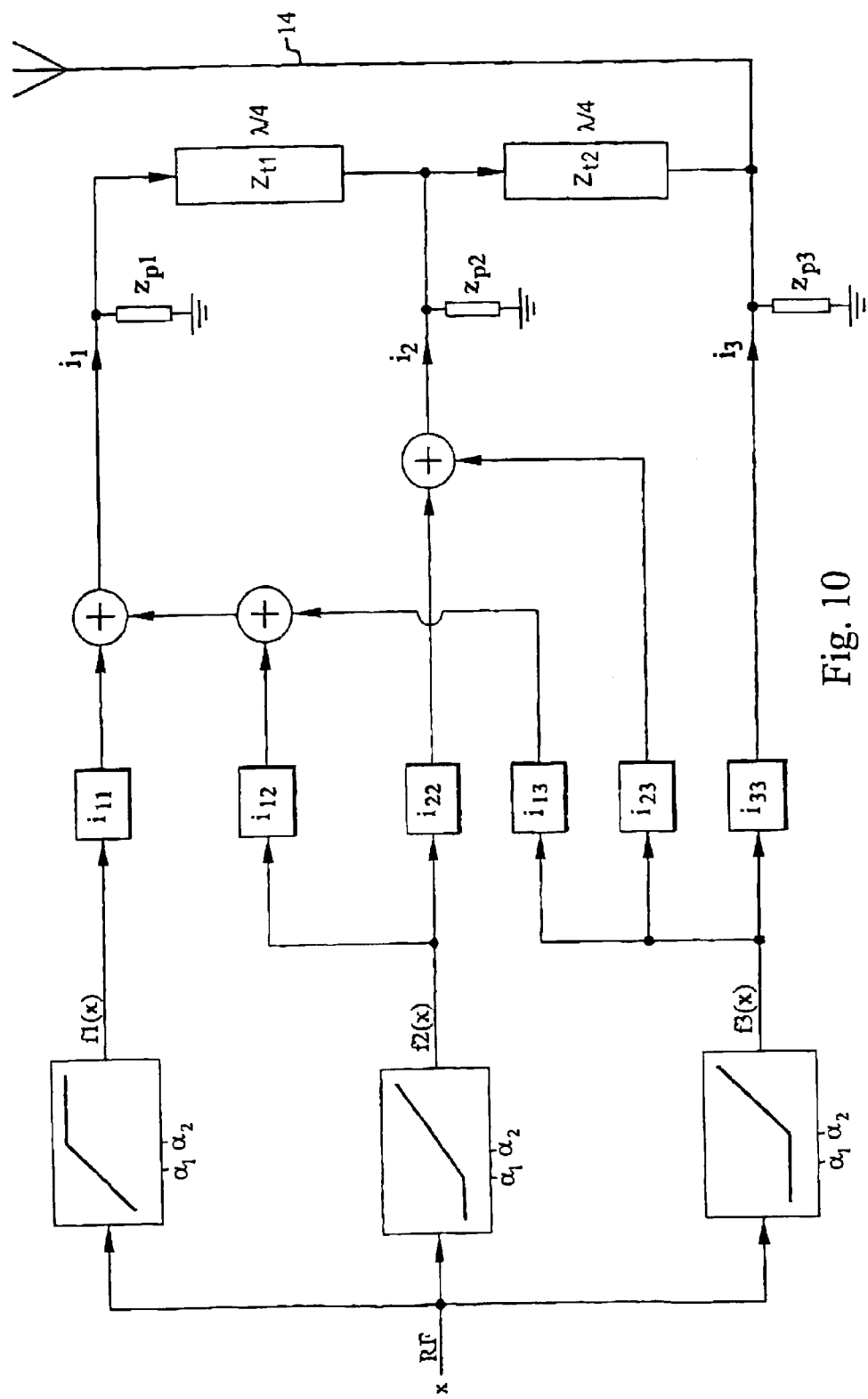
FIG. 10 is a simplified block diagram of a multi-stage embodiment of the composite amplifier in accordance with the present invention.

The general case of multistage Doherty amplifiers will now be exemplified with a three-stage amplifier, which is illustrated in FIGS. 9 and 10. In the output network of FIG. 9 the following definitions will be used:

$$z_{11} = \frac{v_1}{i_1}\bigg|_{\substack{i_2=0\\i_3=0}} \quad z_{22} = \frac{v_2}{i_2}\bigg|_{\substack{i_1=0\\i_3=0}} \quad z_{33} = \frac{v_3}{i_3}\bigg|_{\substack{i_1=0\\i_2=0}}$$

$$z_{12} = z_{21} = \frac{v_1}{i_2}\bigg|_{\substack{i_1=0\\i_2=0}} \quad z_{13} = z_{31} = \frac{v_1}{i_3}\bigg|_{\substack{i_1=0\\i_2=0}} \quad z_{23} = z_{32} = \frac{v_2}{i_3}\bigg|_{\substack{i_1=0\\i_2=0}}$$

In FIG. 10 the three non-linear functions $f1(x)$, $f2(x)$ and $f3(x)$ of the input signal are all assumed to have the same amplitude slope as the normalized input signal x (which a slope equal to 1). The phases of these signals are also identical to that of input signal x.

The first function, $f1(x)$ is equal to x below the second transition point $\alpha_2$. Above this point it has the same phase as x and the amplitude is equal to a constant $\alpha_2$.

The second non-linear function $f2(x)$ is zero until the amplitude of x is at $\alpha_1$, and its amplitude rises linearly from there.

The third function $f3(x)$ behaves like the second, but starts rising above $\alpha_2$.

The first and third functions added together return the input signal x. The last statement (and generally that the sum of every other function returns the linear input signal) is the main requirement, even if the non-linear functions are non-abrupt and/or shaped by polynomials of the input amplitude or power. The shapes of the signals that are primarily designed to suppress voltages above transition points are only important to the extent that they should suppress voltages good enough.

The voltage at main amplifier 10 should be as constant as possible at all levels above the first transition point $\alpha_1$. As before this is partly achieved by inverse filtering for the impedance seen at this power amplifier by applying $V_{max}/\alpha_1{}^*z_{11}{}^{-1}$ to $f1(x)$ for the main amplifier current. For achieving a linear output, the current from second auxiliary amplifier 12b must transform into a signal with the same frequency dependence at the output node as the transformed current from main amplifier 10. This is achieved through the application of filter $V_{max}/\alpha_1{}^*z_{11}{}^{-1}*z_{31}*z_{33}{}^{-1}$ to $f3(x)$ for the current of auxiliary amplifier 12b, and gives rise to different frequency dependencies for the voltages due to currents $i_1$ and $i_3$ at the main amplifier 10 node. Since this causes a non-linear frequency dependence at this node, a compensation must be devised or otherwise the increased peak to average node voltage ratio would harm efficiency. A compensation can be found by taking the difference between the frequency dependence at main amplifier 10 of $i_3{}^*z_{13}$ optimized for correct output and the frequency dependence of $i_3{}^*z_{13}$ optimized for flatness at main amplifier 10. This difference in filtering at main amplifier 10 is $V_{max}/(\alpha_1{}^*(1-z_{13}{}^*z_{31}{}^*z_{11}{}^{-1}*z_{33}{}^{-1})$, so the function $f3(x)$ is filtered with this function and inserted as a part of $i_2$, which has high transmission to the main amplifier 10 node. Since this non-linear signal would show up in the output through the non-ideal (ideally zero) transimpedance $z_{32}$, it must also be applied to another current, preferably $i_1$, and both of these parts must together cancel at the output node of auxiliary amplifier 12b and have a flat frequency response at main amplifier 10. Appending (i.e. multiplying) the extra filter $z_{32}{}^*z_{11}{}^{-1}$ to the $i_1$ part and the filter $(z_{21}-z_{11}{}^*z_{32}{}^*z_{31}{}^{-1})^{-1}$ to both parts fixes this.

The non-linear function $f2(x)$, which ideally is applied only to $i_2$ and only suppresses the voltage rise at main amplifier 10, will in the practical uncompensated case be seen at the output due to the transimpedance $z_{32}$. The compensation for this is the same as for the "difference term" compensation just described. The filter $-V_{max}/\alpha_1{}^* (z_{21}-z_{11}{}^*z_{32}{}^*z_{31}{}^{-1})^{-1}$ is applied to $f2(x)$ for the $i_2$ part and the same filter without the minus sign but with an appended filtering of $z_{32}{}^*z_{31}{}^{-1}$ is applied to $f2(x)$ for the $i_1$ part.

The schematic appearance of the derived network, with the filters designated by $i_{ab}$, where a,b=1, 2, 3, is illustrated in FIG. 10. The b's designate the function number and the a's the target power amplifier. Since the output of the filters (in this model) are currents and the signals fn(x), where n=1, 2, 3, are dimensionless, while the filters have the dimension of current.

Figure 11:
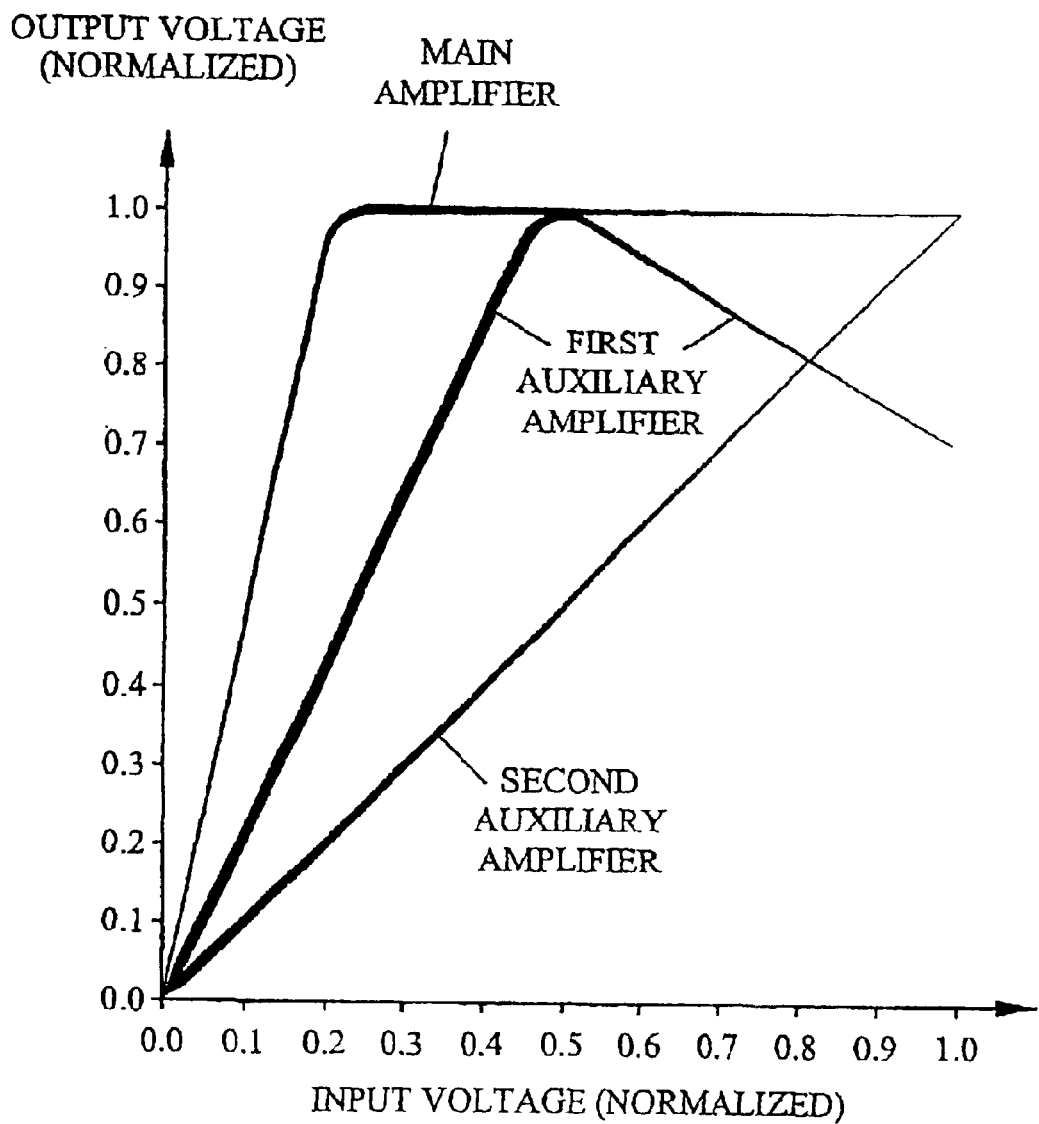
FIG. 11 is a diagram illustrating the input-output voltage characteristics of a multi-stage composite amplifier in accordance with the present invention.

What has just been described is an optimization of the voltage at main amplifier 10 only. This makes sense since it should have a constant amplitude for a larger part of the dynamic range than auxiliary amplifier 12a. The voltage at auxiliary amplifier 12a has been left unattended, even though it should ideally have a flat voltage amplitude for input signals above the second transition point $\alpha_2$. If losses are present in the circuit, load and quarter-wave line impedances can be changed, and transition points can be moved to maximize the efficiency. If the voltage at auxiliary amplifier 12a has not been compensated, losses can make its ideally constant level above the transition point droop, even if the "knee" can be made to reach the target $V_{max}$. This is shown in FIG. 11.

A compensation for auxiliary amplifier 12a above the second transition point can be found by taking the sum of the voltage responses for the non-linear functions that are sloping above this point, i.e. f2($x$) and f3($x$), at auxiliary amplifier 12a. A function with this amplitude and frequency response is then fed in anti-phase to the auxiliary amplifier 12a output node, through applying the function f3($x$) through different filters to the currents $i_1$ and $i_3$. The current $i_1$ is the main channel to auxiliary amplifier 12a, and the $i_3$ part is included to cancel the non-linearity in the output. After the conditions for cancellation have been established (as before), the obtained filter quotient is appended to the $i_1$ part and the composite frequency dependence at the auxiliary amplifier 12a node is calculated. The inverse of this filter term is then appended to both parts. The result of these operations is a flat region above the second transition point for auxiliary amplifier 12a, at the expense of the flatness at main amplifier 10. For low-loss circuits, the main amplifier 10 node voltage is not deteriorated much, but when losses are present, it gets an upward slope above the second transition point. This effect probably reduces the efficiency more than what is gained by having an optimal auxiliary amplifier 12a voltage.

In the previous examples, the starting point has been to obtain frequency-independent linear and non-linear voltages at main amplifier 10. This is good for optimizing efficiency, since the flat part of the voltage range can be held as close to the maximum as possible without saturation. There are of course also other ways to obtain close to optimum operation, which may suit a certain type of implementation better. Some of these will be discussed in the following paragraphs.

The principles of operation nave been described in terms of a dimensionless, normalized input signal and an "end" product in the form of specially designed current outputs from the power amplifiers. The transistors and all other components of a practical amplifier system have thus been embedded into the filter equations. In reality the input signal can be in a variety of forms, and multiple stages of processing can in some implementations separate the generation of the non-linear signals, and application of the cross-coupled filters from the actual power amplifiers. For example, the input signal can be in purely digital form and at low frequency, if digital signal processing is used for shaping the drive functions. The transformation into voltages for driving the power transistors (which transform their input voltage into controlled output currents) is then performed by a processing chain comprising digital to analog conversion, mixers, filters and amplifiers, until the drive signals to the power amplifiers are at the right frequency and in the right form and size. The non-linear functions and the cross-coupled filters will in this case be implemented entirely in the digital domain, and may include a compensation for the frequency dependence of the up-conversion chain and transistor input matching circuits.

In other variants, the non-linear processing is done by non-linear circuits at the final frequency or at an intermediate frequency. A variety of ways to do this are available, including biasing low-power transistors for class C operation, multiplication with a "shaping function" derived from the RF signal and multiplication of the linear signal with a shaping function produced at baseband. The cross-coupled filters can then be implemented by lumped and/or distributed filter techniques, having current in/voltage out or voltage in/current out, being doubly terminated or any other suitable filter technique that can give the right filter response over the desired band. The same holds for the filters that are not cross-coupled.

In either variant, there are some basic rules that apply. Firstly, all branches must have matched delays, i.e. the phase and time relations between the different signals must be strictly controlled. Since filters and non-linear processing have delays, any branch without a function (non-linear or filter) must be compensated by an equal delay. The deliberate delays that are employed to establish desired phase relations between signals (i.e. quarter wave line) need not be compensated for. Secondly, the amplitude of all signals must be matched for the distortion-cancellation and efficiency-boost to work optimally.

Although the filters may seem complicated, since they are assembled from many frequency-dependent impedances and transimpedances, the complexity of an implementation can be reduced in several ways. In a digital implementation, the filters can be assembled from measured impedances by multiplication and division in the frequency domain. The thereby assembled filters can then either be used directly for filtering in the frequency domain, or be converted to time-domain filters. A frequency-domain window can be applied for restricting the filters to suitable bandwidths. Typically filters are implemented as FIR (Finite Impulse Response) filters having a length of 20–40 taps.

As discussed in the summary section, if the auxiliary amplifier is producing the non-linear current by working in class C, its non-linear output current can be modeled separately for use in the cross-coupling. The auxiliary amplifier current function can in this case not be filtered arbitrarily, since the non-linearity is in the end of the processing chain (in the power transistor itself). In such cases, all distortion-cancellation is in the cross-coupled path, both the filters and the model of the class C amplifier non-linear function. The linear path (to main amplifier 10) can of course also have compensation filtering in this case, as can the path to auxiliary amplifier 12, specifically to compensate for the other frequency dependencies in this path.

The impedance of the antenna network as seen at the power amplifier output is generally not known in detail when producing an amplifier. However, it has an impact on the impedances in the Doherty output circuit. Some methods that can be used to get a better known impedance include using an isolator in the antenna path, to get a more wideband resistive characteristic, or to insert a resonator or filter that is more narrowband than the antenna network, so that the impedance of this part (which is assumed to be reasonably known already in the production stage) dominates instead of the actual antenna impedance.

Sometimes it is impractical to implement all of the filters that are needed for optimal operation. There are also great differences between the filters regarding how much they contribute to the overall performance (distortion reduction and efficiency). Therefore, it can be useful to design reduced variants with dropped or simplified filters. Generally, these reduced variants can be successful if some filter or part of a filter can be regarded as approximately constant over the frequency range of interest. The gain and phase value of the filter at the center frequency can then be substituted for the full frequency-dependent filter. For cancellation of distortion in the output to work, there is generally a requirement for a specific filter quotient (as previously described) between two branches. This means that an inverse of a filter, which can be hard to implement, can be dropped and the filter itself be inserted in the other branch. Both branches must then be compensated for the gain and phase of the changed filter (at the center frequency). A very reduced variant can be found by dropping the frequency-dependence altogether. This can possibly be useful if the frequency range of operation is quite narrow or if losses dominate the generation of distortion in the output.

A simple but elegant method for obtaining the filters $z_{21}$ and $z_{22}$ is to use input-side copies of the Doherty output network, containing the same passive circuit elements that are present in the actual output network. When such a network is driven by a current generator (small-signal transistor) on the input side, the output voltage automatically has the right frequency dependence. The requirement for this to work is that the transistor output parasitic elements, the quarter-wave line and the antenna network impedance can be accurately modeled. A possibility is to scale the impedance of all elements in the network to get more realizable values and/or better voltage and current levels.

The filtering by $z_{21}$ can be obtained by using $z_{12}$ instead. In this way, the filtering of the non-linear signal by both impedances can be done with only one copy of the output network. The drawback is that the load (over which to obtain the voltage) in this case is the model of the parasitic elements of the transistor. The load when using $z_{21}$ (and $z_{22}$) is a model of the antenna network impedance in parallel with the model of the output parasitics of the auxiliary amplifier 12 transistor. The antenna impedance is better known, does not spread much between amplifiers, and has a more convenient magnitude than the parasitics. Small-signal amplifiers with a suitable input impedance are thus easy to find that can be complemented with reactances to form a model of the antenna network impedance.

For an implementation using only RF/microwave techniques, the simple Doherty amplifier can be sub-optimally implemented by using the ideas from the previous paragraphs. The sub-optimality comes from rearranging the equations to make the inverse filters unnecessary, and will be shown not to degrade the efficiency significantly from the previously derived optimal operation. The distortion cancellation at the output is still complete. The non-linear function can (and is in this example assumed to) be generated by a class C amplifier with its bias adjusted for a certain transition point.

Figure 12:
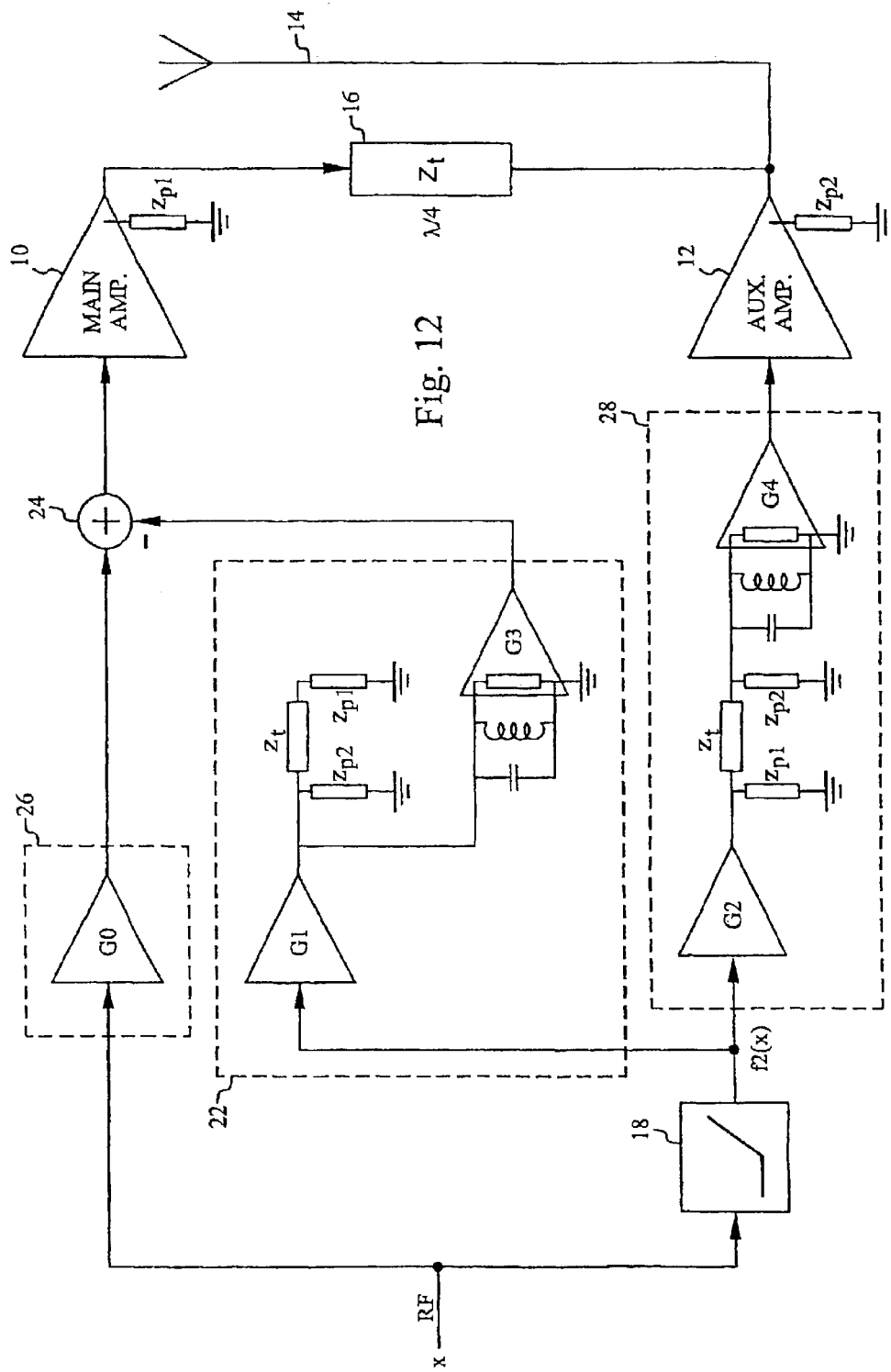
FIG. 12 is a block diagram of a simplified embodiment of the composite amplifier in accordance with the present invention.

The inverse filter to $z_{21}$ is taken away from the cross-coupled path, and this filter itself is instead inserted into the path to auxiliary amplifier 12. The gain and phase of the filter is replaced by its value at center frequency. The inverse of the composite filter $z_{12}-z_{22}*z_{21}^{-1}*z_{11}$, in the direct and cross-coupled paths is also replaced by its gain and phase values at the center frequency, as is the filtering with the inverse of $z_{11}$ in the linear path to main amplifier 10. What is left is only the basic filtering required for perfect distortion cancellation at the output plus compensating gains for maximizing the efficiency under these (sub-optimal) conditions, The simplified schematic of such a circuit is shown in FIG. 12. If the non-linear function of the RF signal, f2($x$), is produced by a class C amplifier, it can also be produced by driving amplifiers G1 and G2 in class C mode. The signal levels in the cancellation networks are meant to be low, to minimize power consumption. The amplification to higher voltage is preferably done in the preamplifiers to main amplifier 10 and auxiliary amplifier 12.

The antenna network impedance is in this case modeled by a 50 Ohm resistance with a parallel resonator tuned to the center frequency. Amplifiers G1 and G2 are (identical) controlled current generators. The input impedance of (identical) amplifiers G3 and G4 together with appropriate additional reactances emulate the antenna network impedance $Z_{ANT}$, and possible parasitics on the output of G1 and G2 are included in the corresponding $Z_{p2}$ and $Z_{p1}$. Amplifier G0 provides a matching gain, delay and phase for the linear part to main amplifier 10. The power amplifiers include necessary input matching networks and preamplifiers.

Figure 13:
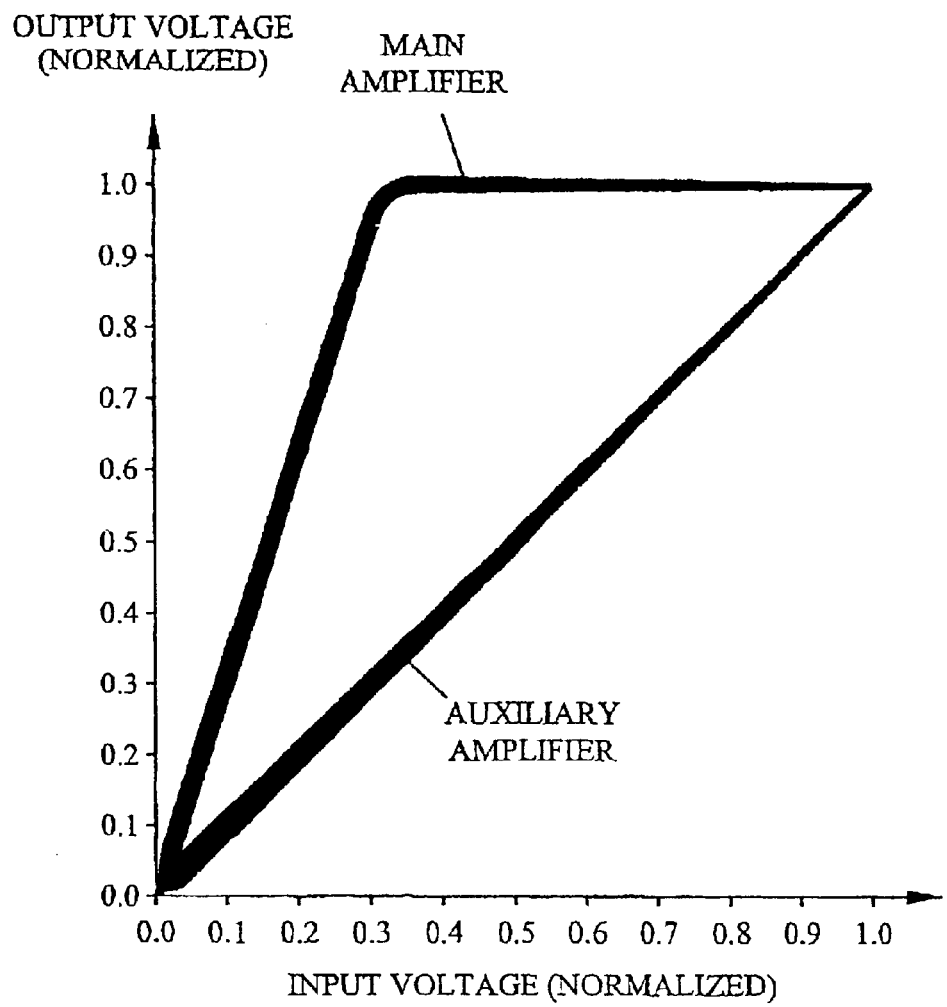
FIG. 13 is a diagram illustrating the input-output voltage characteristics of the simplified composite amplifier in accordance with FIG. 12.

When all gains are optimally adjusted, and the output network, parasitics and antenna network impedance are properly emulated by their input side models, the performance will be close to optimal. The voltage magnitudes at main amplifier 10 and auxiliary amplifier 12 for the described situation are illustrated in FIG. 13. These curves have been obtained under the same conditions and with the same bandwidths as the fully optimized case shown in FIG. 7. The voltage overshoot and undershoot at main amplifier 10 (the width of the flat part of the curve) is only slightly higher for the non-optimal case, which means that the efficiency is very little degraded. An increased frequency dependence of the output signal (voltage at auxiliary amplifier 12) is seen as a widening of the voltage trace, although the amplitude part of this is hardly noticeable in a spectral plot.

In practice, the performance of the described methods will depend on how well the characteristics of the Doherty output network are known. Measuring transimpedances in the output network is often hard to do directly, since the (RF) voltage probe and the current injector will always have parasitics that must be taken into account. Indirectly, impedance parameters (Z-parameters) can be extracted by traveling wave measurements (S-parameters). A combination of different parameters that are easy to measure can also be selected. The required filters or emulating networks can then be designed using extracted impedances and transimpedances.

The exact values of transimpedances and impedances are hard to obtain, and are in many cases not important in themselves. Having the correct quotient of two frequency responses and the correct gains and phases in the two paths to the common output are the most important goals for achieving distortion cancellation in the output. In the same way is the gain and phase matching of the linear part to the combined non-linear parts the most important criterion when optimization for flatness above the transition point. Assuming that the load and quarter-wave line impedances are correct, the amplitudes of flat-voltage regions and the output voltages can then be adjusted to maximum values by a common gain adjustment.

Using the philosophy of the previous section, a trimming scheme can be devised. By injecting a signal at various points in the circuit, and trimming until cancellation or another measurable condition occurs, the circuit can be optimized for linearity and efficiency. The cancellation of distortion in the output can be handled first, by substituting a wideband test signal for f2($x$). For doing this under realistic operating conditions, main amplifier 10 can be simultaneously excited by another signal (that is easily distinguishable in the output signal). The filters, gains and phases of the two canceling paths to the output can then be trimmed, since they are fed with the same signal.

The gain of the linear path to main amplifier 10 can be adjusted (at several frequencies to ensure amplitude flatness) by observing the starting point of compression in the output for a main. Compression should occur at a power corresponding to the transition point, if f2($x$) is deactivated.

The last criterion, optimal suppression of the voltage rise at main amplifier above the transition point, requires phase and gain matching of the linear part to the composite non-linear part at this node. A way to do this is to observe spectral regrowth, possibly with a simple two-tone test, and adjust until this is minimized. Other ways can be to adjust the phase first by cancellation in two paths to the output and adjust the gains later, knowing that the phase is correct. Either way, the phase matching, or electrical path length difference, should be sufficiently correct (within a fraction of a wavelength) before adjustment in order to avoid local minima at multiple wavelengths away from the correct one. A method of trimming while observing the spectral regrowth using a realistic (wideband, multi-carrier) signal while simultaneously keeping track of the power efficiency of the amplifier can also be used.

Probing the voltage at main amplifier 10 for flatness above the transition point, instead of just observing the efficiency, can also help in achieving maximum efficiency. The probe must have high impedance to avoid increasing the losses or otherwise detrimentally affect the conditions in the circuit. Apart from that, the probe impedance can be incorporated in the distortion-canceling and efficiency-boosting compensations.

Many parameters of the output network and amplifiers are slowly changing, due to aging, temperature variations and other environmental changes. This means that the distortion cancellation and efficiency of the amplifier may degrade from its initial level. To cope with this problem, the filters and gains in the cancellation network and the linear path can be made to respond in real time to the parameter variations.

The adjustments described in the previous paragraphs can be automated by monitoring the output and possibly the voltage at main amplifier 10 and relate this to the signals inputted at various points in the network. The measured values can then be used for changing the parameters of the input network. An alternative is to insert special signals that are only used for measurements (pilot signals). A pilot signal used for adjusting the cancellation will itself cancel in the output when the input network is properly adjusted.

An entirely digital implementation of the distortion-cancellation and efficiency-boosting techniques will have advantages over an analog implementation in that the filters will be more accessible to detailed adjustments. An analog implementation relies on the adjustments of circuit elements, but the circuit itself is hard to change during operation.

Throughout this text, the assumption has been that saturation is something to avoid and that the Doherty methods should be used with extra tricks to ensure that the transistors are kept out of saturation, while maximizing efficiency and minimize distortion. However, the main reason for this is that the saturation of the lower power amplifiers, especially main amplifier 10, will otherwise occur right in the power levels where a multi-carrier signal statistically spends most of its time. The distortion in the output due to a non-linearity in this region is therefore very large. Standard power amplifiers are usually driven into saturation in the top of their output power range, to get some extra output power and increased average efficiency. The distortion coming from this is quite low, for an amplifier driven by a multi-carrier signal, since the probability density is exponentially decreasing towards the high end of the (quasi-) Rayleigh distribution of amplitude levels. Similar methods can be used for the improved Doherty amplifiers, by modifying the non-linear current to give a similar voltage rise on all amplifiers above compression. Partly, this will take care of itself when auxiliary amplifier 12 goes into saturation, so a deliberate modification might not be necessary. The delivered current will then be reduced, with a voltage rise also at main amplifier 10 as a result. Some extra power, better average efficiency, and a slightly worse distortion will be the result. The transition point can of course also be changed accordingly to take full advantage of this solution. Below this compression region everything will still be linear and non-saturated.

Since saturation is a somewhat vaguely defined state, with a transition region in which the power amplifier is neither a pure current source nor a hard-limited voltage source, solutions can be found in which a power amplifier is held slightly saturated over the "flat" voltage range. The methods proposed by the present invention can be used to control this amount of saturation very precisely so that efficiency is increased, over that of a strictly non-saturated amplifier, but the distortion does not grow above a set limit.

The proposed solution does not preclude the use of additional linearization techniques. After the efficiency has been optimized and the difficult frequency dependent distortion and other large-scale Doherty-specific distortion products has been reduced by the cancellation method, the residual distortion coming from device-specific non-linearities can be addressed. Two popular methods for distortion reduction in wideband RF and microwave amplifiers are the feedforward method and the pre-distortion method. As indicated in the background section, the reduced frequency-dependent and large-scale distortion will ease the requirements for the additional linearization techniques.

An alternative to linearization loops around the whole amplifier is to linearize the output current for each transistor (power amplifier). This has the added benefit that the distortion cancellation performance of the methods described in above can be more complete, since otherwise the non-linearities of the current generators (transistors) will add distortion products to the voltages that ideally should cancel in the output. Since these distortions are generally not equal in shape, although they can be similar in magnitude, the residual part that can not be cancelled completely will put a limit on the cancellation of the Doherty-specific distortion.

Traditionally, Doherty amplifiers have been known to have a linearity "inversely proportional to their efficiency" [7]. The methods presented in this document remove this tradeoff, since they can simultaneously optimize the linearity and efficiency of Doherty amplifiers. Further, they can do this over very large bandwidths with retained performance. The solution is effective for all types of Doherty amplifiers and for many types of non-idealities, both those that depend on narrowband approximations and those due to linear parasitics.

The possibility of wider relative bandwidths and higher efficiency enables the use of (the modified) Doherty amplifiers in previously unattainable areas. For example, the wider relative bandwidths makes it possible to use the Doherty technique for radio systems at lower frequency, or to make high-efficiency amplifiers for entire system bandwidths instead of smaller chunks or individual channels. Even if a smaller range of bandwidth is actually used, the method enables the making of a unified amplifier with flexible placement of the used bandwidth or channel within a much larger bandwidth. This implies a lower manufacturing cost, since fewer variants have to be manufactured.

Many different implementations are possible. Digital or analog signal processing can be used, and the processing can be performed with a variety of techniques, at baseband, intermediate or final (RF) frequencies. Arbitrary combinations of these can be used, matching the requirements for a function with a convenient way of implementing it. The solution can be used statically, optimized at the time of manufacture or at specific times during maintenance, or dynamically adaptive, for continuously optimizing the linearity and efficiency of the amplifier.

In the above description it has been assumed that a cross-coupled signal emulating the non-linear behavior of the output current of auxiliary amplifier is subtracted from the input signal to main amplifier 10. However, as will be shown below with reference to FIG. 14–17, the cross-coupling is actually not strictly necessary. The same effect may be accomplished in other ways.

Figure 14:
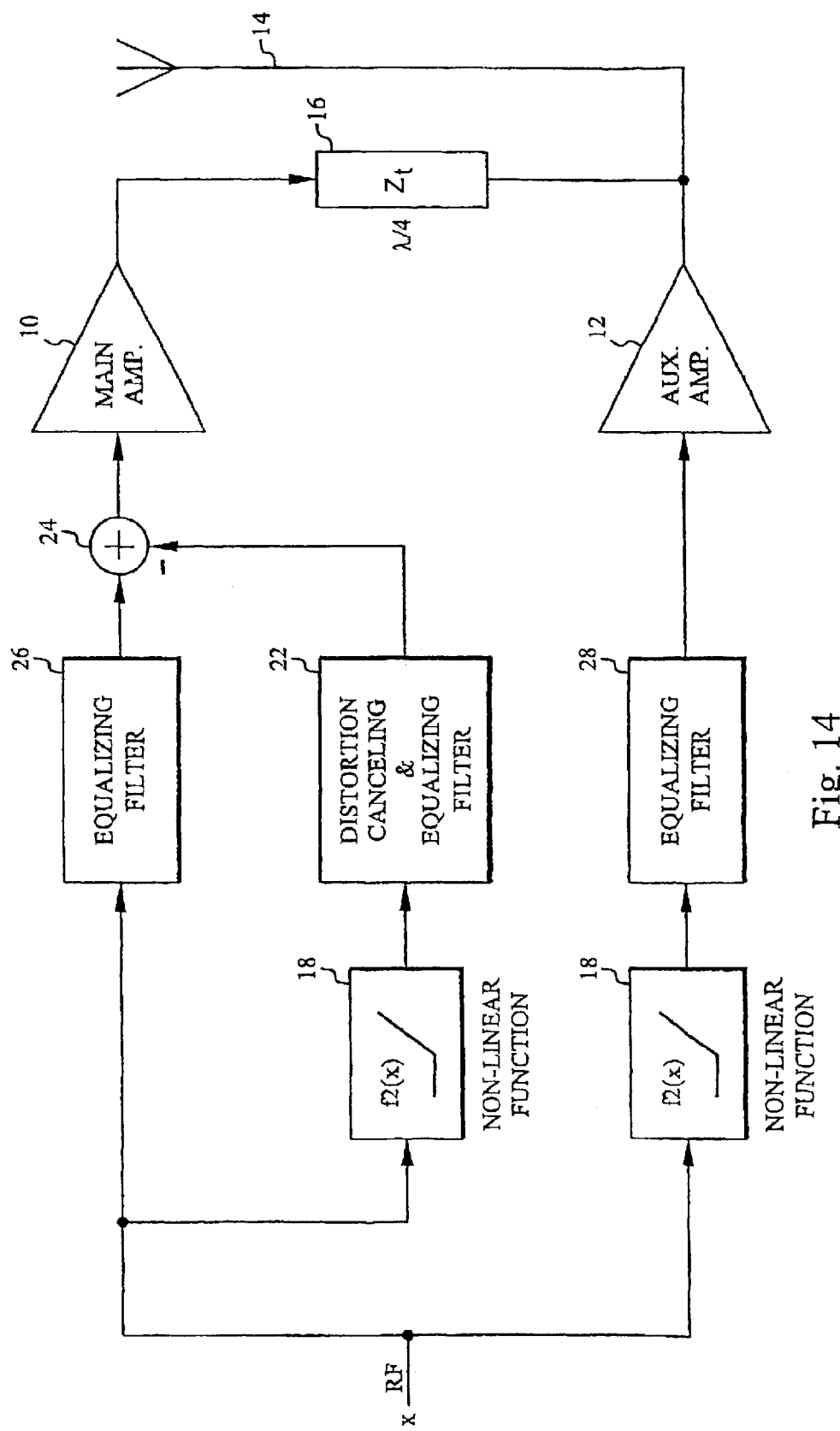
FIG. 14 is a simplified block diagram of a another exemplary embodiment of the composite amplifier in accordance with the present invention.

FIG. 14 is a simplified block diagram of a another exemplary embodiment of the composite amplifier in accordance with the present invention. This embodiment is equivalent to the embodiment of FIG. 5. The difference is that the non-linear function 18 has been duplicated in the upper input branch to main amplifier 10. The filters are the same as in FIG. 5.

Figure 15:
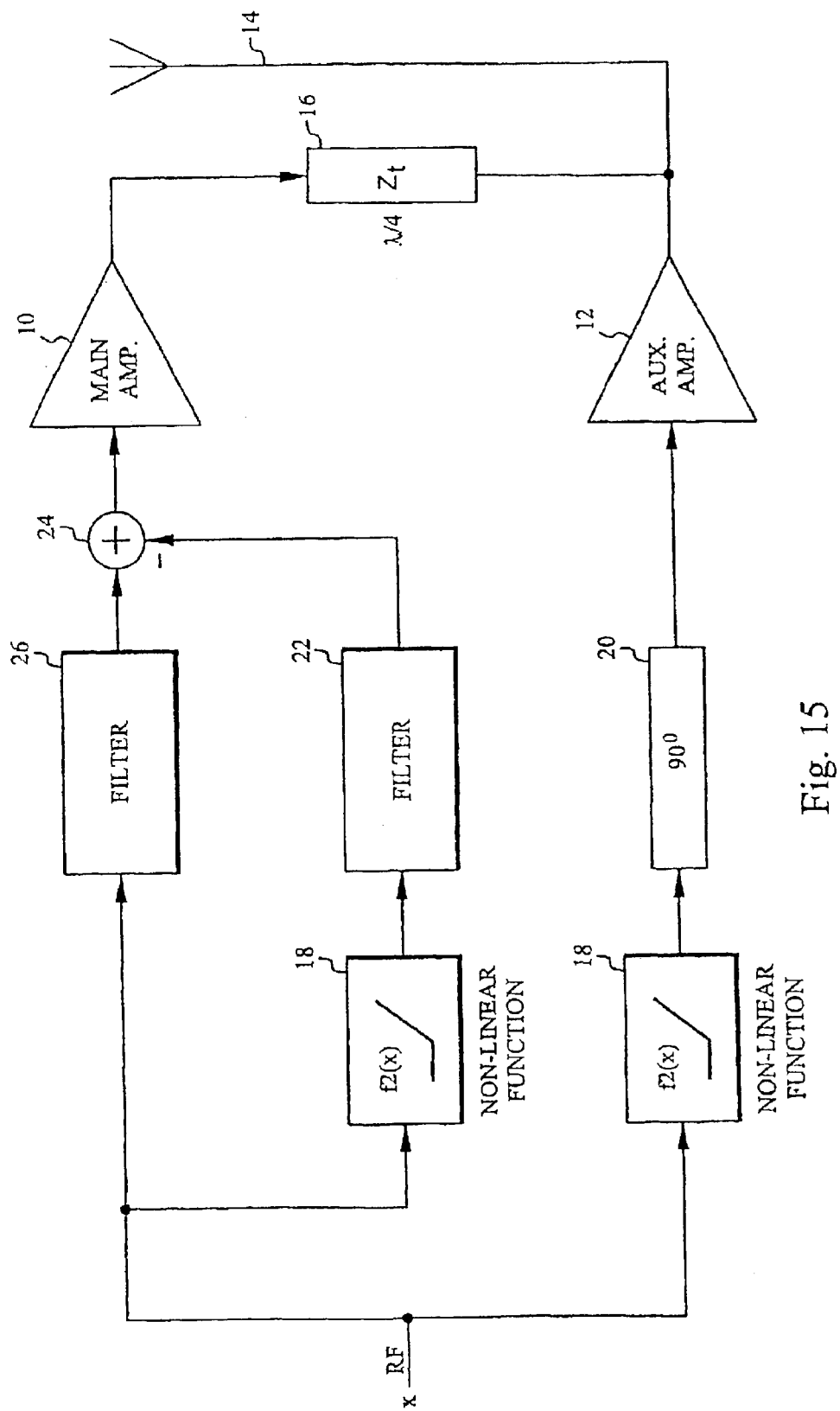
FIG. 15 is a simplified block diagram of another exemplary embodiment of the composite amplifier in accordance with the present invention.

FIG. 15 is a simplified block diagram of another exemplary embodiment of the composite amplifier in accordance with the present invention. This embodiment is a simplified version of the embodiment of FIG. 14. In this embodiment filtering is only performed in the upper input branch to main amplifier 10. Furthermore, the filters are proportional to:

Filter 22:

$$z_{22} * z_{21}^{-1}$$

Filter 26:

$$z_{11}^{-1}$$

Figure 16:
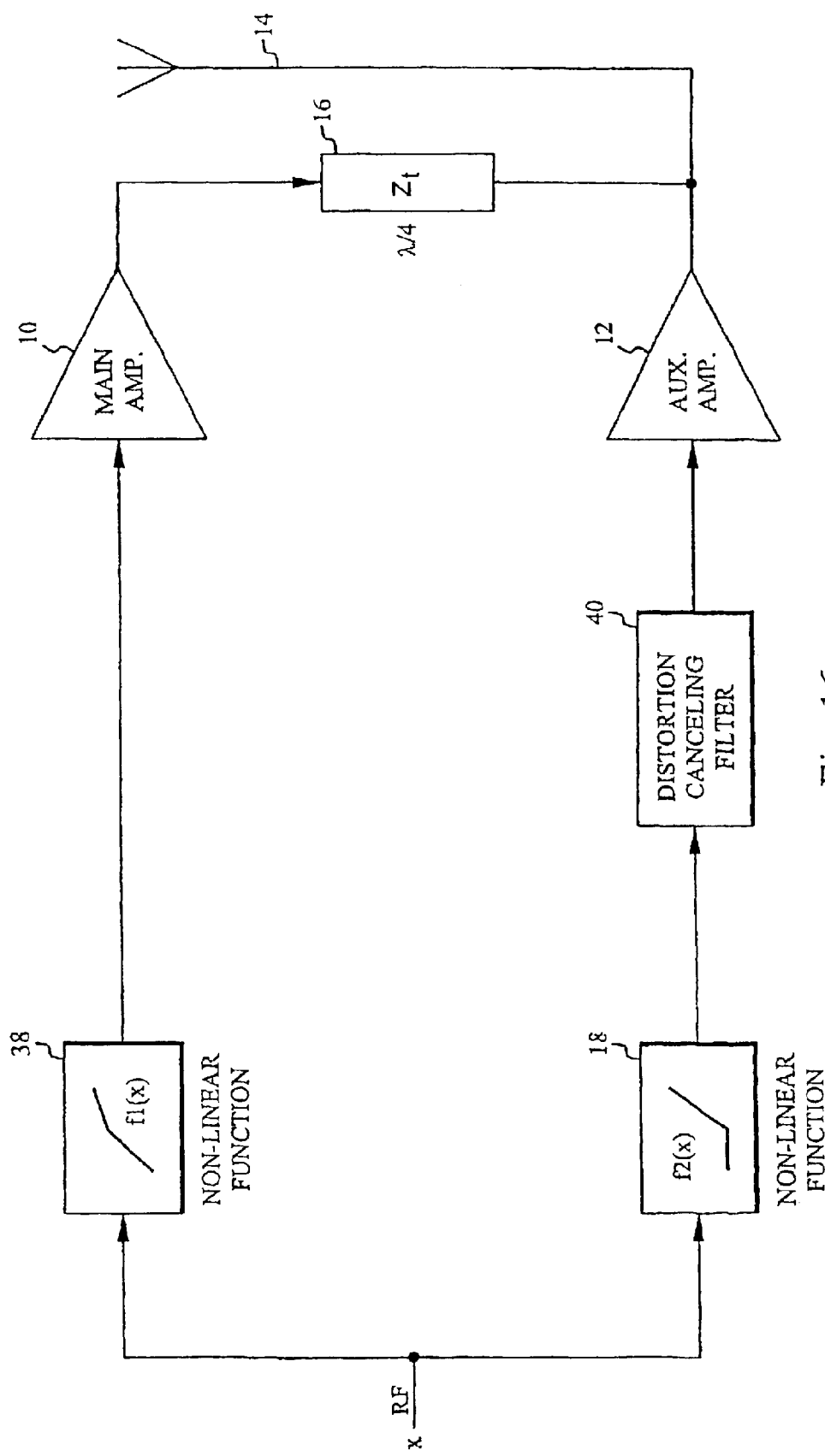
FIG. 16 is a simplified block diagram of a another exemplary embodiment of the composite amplifier in accordance with the present invention.

FIG. 16 is a simplified block diagram of a another exemplary embodiment of the composite amplifier in accordance with the present invention. In this embodiment there are different non-linear functions in the lower and upper branches. The upper non-linear function f1(x) in block 38 has two constant slopes, a first slope equal to 1 up to the transition point, and a second, reduced slope counteracting the non-linearity in the lower branch. A distortion canceling filter 40 is provided only in the lower branch. This filter is proportional to:

$$z_{21} * z_{22}^{-1}$$

Figure 17:
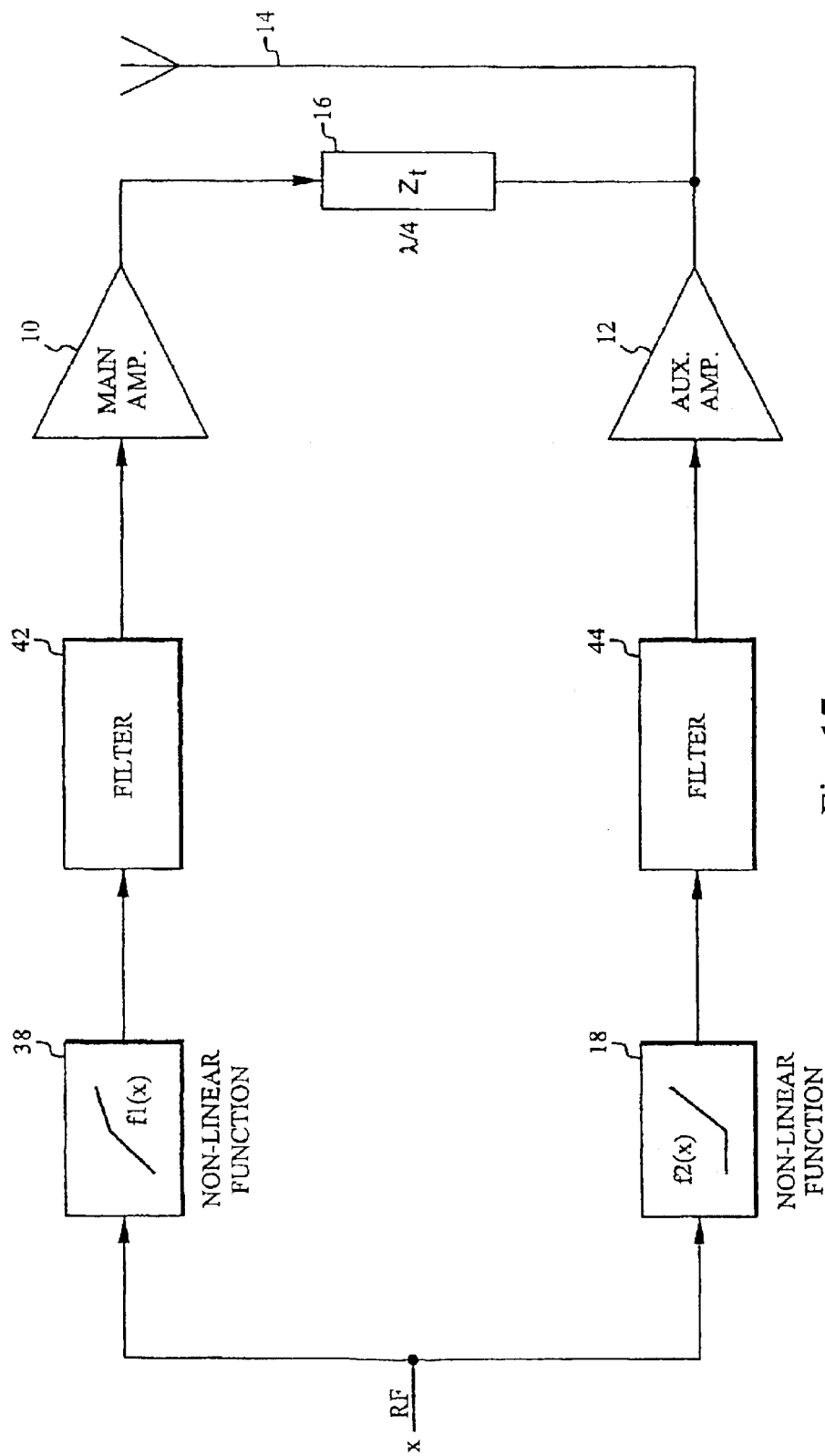
FIG. 17 is a simplified block diagram of another exemplary embodiment of the composite amplifier in accordance with the present invention.

FIG. 17 is a simplified block diagram of another exemplary embodiment of the composite amplifier in accordance with the present invention. This embodiment, which is a more elaborate version of the embodiment in FIG. 16, has a filter 42 in the upper branch and a filter 44 in the lower branch. The filters are proportional to:

Filter 44:

$$z_{21} * z_{21}^{-1} * z_{11}^{-1}$$

Filter 42:

$$z_{11}^{-1}$$

It will be understood by those skilled in the art that various modifications and changes may be made to the present invention without departure from the scope thereof, which is defined by the appended claims.

REFERENCES

[1] F. H. Raab, "Efficiency of Doherty RF Power Amplifier Systems", IEEE Trans. Broadcasting, vol. BC-33, no. 3, pp. 77–83, September 1987.
[2] U.S. Pat. No. 5,420,541 (D. M. Upton et al.).
[3] U.S. Pat. No. 5,568,086 (J. J. Schuss et al.).
[4] U.S. Pat. No. 5,786,727 (B. E. Sigmon).
[5] U.S. Pat. No. 5,025,225 (Tajima et al.).
[6] D. M. Upton et al. "A New Circuit Topology to Realize High Efficiency, High Linearity, and High Power Microwave Amplifiers", IEEE Proc. RAWCON'98.
[7] WO 97/20385 (J. F. Long).

What is claimed is:

1. A composite amplifier including:
   a main power amplifier and an auxiliary power amplifier, which are connected to a load over a Doherty output network; and
   means for emulating and compensating for the non-linear behavior of the output current of said auxiliary power amplifier in the input signal to said main amplifier.

2. The composite amplifier of claim 1, including means for equalizing the frequency response of said composite amplifier.

3. The composite amplifier of claim 1, including means for cross-coupling and subtracting a filtered version of the auxiliary amplifier input signal from the main amplifier input signal.

4. The composite amplifier of claim 3, including a cross-coupling filter emulating the impedance of said auxiliary amplifier and compensating for the transimpedance between said main and auxiliary amplifiers.

5. The composite amplifier of claim 3, including a cross-coupling filter emulating the transimpedance from said auxiliary amplifier to the output node and compensating for the transimpedance from said main amplifier to the output node.

6. The composite amplifier of claim 4, including input side filters for equalizing the frequency responses of said main and auxiliary amplifiers.

7. A transmitter including:
   a composite amplifier with a main power amplifier and an auxiliary power amplifier, which are connected to a load over a Doherty output network; and
   means for emulating and compensating for the non-linear behavior of the output current of said auxiliary power amplifier in the input signal to said main amplifier.

8. The transmitter of claim 7, including means for equalizing the frequency response of said composite amplifier.

9. The transmitter of claim 7, including means for cross-coupling and subtracting a filtered version of the auxiliary amplifier input signal from the main amplifier input signal.

10. The transmitter of claim 9, including a cross-coupling filter emulating the impedance of said auxiliary amplifier and compensating for the transimpedance between said main and auxiliary amplifiers.

11. The transmitter of claim 9, including a cross-coupling filter emulating the transimpedance from said auxiliary amplifier to the output node and compensating for the transimpedance from said main amplifier to the output node.

12. The transmitter of claim 10, including input side filters for equalizing the frequency responses of said main and auxiliary amplifiers.

13. The composite amplifier of claim 1, wherein the means for emulating and compensating for the non-linear behavior of the output current of said auxiliary power amplifier in the input signal to said main amplifier comprises:
   a subtractor having an output terminal connected to an input terminal of the main amplifier;
   a filter having an output terminal connected to a first input of the subtractor, the first filter being an equalizing filter;

a second filter having an output terminal connected to a second input of the subtractor whereby an output of the second filter is subtracted from an output of the first filter, the second filter being a distortion canceling and equalizing filter;

a first non-linear function having an output terminal connected to an input terminal of the second filter;

the first non-linear function and the second filter being connected to receive a same RF signal as inputs.

14. The composite amplifier of claim 13, further comprising a third filter having an output terminal connected to an input terminal of the auxiliary power amplifier, the third filter being an equalizing filter;

a second non-linear function having an output terminal connected to an input terminal of the third filter;

wherein the same RF signal is applied to each of the first filter, the first non-linear function, and the second non-linear function.

15. The composite amplifier of claim 1, wherein the means for emulating and compensating for the non-linear behavior of the output current of said auxiliary power amplifier in the input signal to said main amplifier comprises:

a subtractor having an output terminal connected to an input terminal of the main amplifier;

a first filter having an output terminal connected to a first input of the subtractor;

a second filter having an output terminal connected to a second input of the subtractor whereby an output of the second filter is subtracted from an output of the first filter;

a non-linear function having an output terminal connected to an input terminal of the second filter;

the non-linear function and the second filter being connected to receive a same RF signal as inputs.

16. The composite amplifier of claim 15, further comprising a phase shifter having an output terminal connected to an input terminal of the auxiliary power amplifier;

a second non-linear function having an output terminal connected to an input terminal of the phase shifter;

wherein the same RF signal is applied to each of the first filter, the first non-linear function, and the second non-linear function.

17. The composite amplifier of claim 1, wherein the means for emulating and compensating for the non-linear behavior of the output current of said auxiliary power amplifier in the input signal to said main amplifier comprises a first non-linear function having an output terminal connected to an input terminal of the main amplifier, and further comprising:

a distortion canceling filter having an output terminal connected to an input terminal of the auxiliary power amplifier;

a second non-linear function having an output terminal connected to an input terminal of the distortion canceling filter;

the first non-linear function and the second non-linear function being connected to receive a same RF signal as inputs.

18. The composite amplifier of claim 1, wherein the means for emulating and compensating for the non-linear behavior of the output current of said auxiliary power amplifier in the input signal to said main amplifier comprise:

a first filter having an output terminal connected to an input terminal of the main amplifier;

a first non-linear function having an output terminal connected to an input terminal of the first filter;

a second filter having an output terminal connected to an input terminal of the auxiliary power amplifier;

a second non-linear function having an output terminal connected to an input terminal of the second filter;

the first non-linear function and the second non-linear function being connected to receive a same RF signal as inputs.

19. The transmitter of claim 7, wherein the means for emulating and compensating for the non-linear behavior of the output current of said auxiliary power amplifier in the input signal to said main amplifier comprises:

a subtractor having an output terminal connected to an input terminal of the main amplifier;

a filter having an output terminal connected to a first input of the subtractor, the first filter being an equalizing filter;

a second filter having an output terminal connected to a second input of the subtractor whereby an output of the second filter is subtracted from an output of the first filter, the second filter being a distortion canceling and equalizing filter;

a first non-linear function having an output terminal connected to an input terminal of the second filter;

the first non-linear function and the second filter being connected to receive a same RF signal as inputs.

20. The transmitter of claim 19, further comprising a third filter having an output terminal connected to an input terminal of the auxiliary power amplifier, the third filter being an equalizing filter;

a second non-linear function having an output terminal connected to an input terminal of the third filter;

wherein the same RF signal is applied to each of the first filter, the first non-linear function, and the second non-linear function.

21. The transmitter of claim 7, wherein the means for emulating and compensating for the non-linear behavior of the output current of said auxiliary power amplifier in the input signal to said main amplifier comprises;

a subtractor having an output terminal connected to an input terminal of the main amplifier;

a first filter having an output terminal connected to a first input of the subtractor;

a second filter having an output terminal connected to a second input of the subtractor whereby a output of the second filter is subtracted from an output of the first filter;

a non-linear function having an output terminal connected to an input terminal of the second filter;

the non-linear function and the second filter being connected to receive a same RF signal as inputs.

22. The transmitter of claim 21, further comprising a phase shifter having an output terminal connected to an input terminal of the auxiliary power amplifier;

a second non-linear function having an output terminal connected to an input terminal of the phase shifter;

wherein the same RF signal is applied to each of the first filter, the first non-linear function, and the second non-linear function.

23. The transmitter of claim 7, wherein the means for emulating and compensating for the non-linear behavior of the output current of said auxiliary power amplifier in the input signal to said main amplifier comprises a first non-linear function having an output terminal connected to an input terminal of the main amplifier, and further comprising:

- a distortion canceling filter having an output terminal connected to an input terminal of the auxiliary power amplifier;
- a second non-linear function having an output terminal connected to an input terminal of the distortion canceling filter;
- the first non-linear function and the second non-linear function being connected to receive a same RF signal as inputs.

24. The transmitter of claim 7, wherein the means for emulating and compensating for the non-linear behavior of the output current of said auxiliary power amplifier in the input signal to said main amplifier comprises:

- a first filter having an output terminal connected to an input terminal of the main amplifier;
- a first non-linear function having an output terminal connected to an input terminal of the first filter;
- a second filter having an output terminal connected to an input terminal of the auxiliary power amplifier;
- a second non-linear function having an output terminal, connected to an input terminal of the second filter;
- the first non-linear function and the second non-linear function being connected to receive a same RF signal as inputs.

* * * * *